United States Patent
Siegert et al.

(10) Patent No.: US 11,313,749 B2
(45) Date of Patent: Apr. 26, 2022

(54) PRESSURE SENSOR DEVICE AND METHOD FOR FORMING A PRESSURE SENSOR DEVICE

(71) Applicant: Sciosense B.V., Eindhoven (NL)

(72) Inventors: Joerg Siegert, Graz (AT); Willem Frederik Adrianus Besling, Eindhoven (NL); Coenraad Cornelis Tak, Waalre (NL); Martin Schrems, Eggersdorf (AT); Franz Schrank, Graz (AT)

(73) Assignee: SCIOSENSE B.V., AE Eindhoven (NL)

( * ) Notice: Subject to any disclaimer, the term of this patent is extended or adjusted under 35 U.S.C. 154(b) by 363 days.

(21) Appl. No.: 16/333,671

(22) PCT Filed: Oct. 2, 2017

(86) PCT No.: PCT/EP2017/074953
§ 371 (c)(1),
(2) Date: Mar. 15, 2019

(87) PCT Pub. No.: WO2018/060515
PCT Pub. Date: Apr. 5, 2018

(65) Prior Publication Data
US 2019/0265119 A1    Aug. 29, 2019

(30) Foreign Application Priority Data

Sep. 30, 2016 (EP) ..................................... 16191894
Oct. 31, 2016 (EP) ..................................... 16196616

(51) Int. Cl.
*G01L 19/14* (2006.01)
*G01L 9/00* (2006.01)
(Continued)

(52) U.S. Cl.
CPC .............. *G01L 19/145* (2013.01); *G01L 7/08* (2013.01); *G01L 9/0072* (2013.01); *G01L 9/12* (2013.01);
(Continued)

(58) Field of Classification Search
CPC ............................................. G01L 19/142–147
See application file for complete search history.

(56) References Cited

U.S. PATENT DOCUMENTS 6,705,166 B2 * 3/2004 Leonardson ............ G01L 1/148
73/514.32
6,812,820 B1    11/2004 Fouillet
(Continued)

FOREIGN PATENT DOCUMENTS

CA    2203975 A1 * 5/1998 ........... G01L 9/0072
CN    1543573 A    11/2004
(Continued)

OTHER PUBLICATIONS

European Patent Office, International Search Report for PCT/EP2017/074953, dated Jan. 17, 2018.
(Continued)

*Primary Examiner* — Alexander A Mercado
(74) *Attorney, Agent, or Firm* — Slater Matsil, LLP

(57) ABSTRACT

In an embodiment a pressure sensor device includes a substrate body, a pressure sensor having a membrane and a cap body having at least one opening, wherein the pressure sensor is arranged between the substrate body and the cap body in a vertical direction which is perpendicular to a main plane of extension of the substrate body, and wherein the mass of the substrate body amounts to at least 80% of the mass of the cap body and at most 120% of the mass of the cap body.

9 Claims, 21 Drawing Sheets

(51) Int. Cl.
*G01L 19/04* (2006.01)
*G01L 7/08* (2006.01)
*G01L 9/12* (2006.01)

(52) U.S. Cl.
CPC ............ *G01L 19/04* (2013.01); *G01L 19/143* (2013.01); *G01L 19/147* (2013.01)

(56) References Cited

U.S. PATENT DOCUMENTS

| | | | |
|---|---|---|---|
| 9,297,713 B2* | 3/2016 | Lo | ............................ H01L 24/97 |
| 2014/0053651 A1 | 2/2014 | Besling et al. | |
| 2015/0068315 A1 | 3/2015 | Davis et al. | |
| 2015/0260593 A1 | 9/2015 | Hsu et al. | |
| 2016/0264402 A1* | 9/2016 | Yu | ............................ B81B 7/007 |
| 2019/0234821 A1* | 8/2019 | Besling | ................ B81B 7/0061 |

FOREIGN PATENT DOCUMENTS

| | | |
|---|---|---|
| CN | 101551404 A | 10/2009 |
| CN | 103175639 A | 6/2013 |
| CN | 105000594 A | 10/2015 |
| EP | 1040492 A1 | 10/2000 |
| WO | 0029822 A1 | 5/2000 |
| WO | 2015/106855 | 7/2015 |
| WO | 2015/154173 | 10/2015 |

OTHER PUBLICATIONS

L. Lofdahl, et al., "MEMS-based pressure and shear stress sensors for turbulent flows," Meas. Sci. Technol. 10, IOP Publishing Ltd., Feb. 2, 1999, 22 pages.

Z. Zhang, "Research on Design and Package Technology of Pressure Sensor," DZKD, University of Electronic Science and Technology of China, Master Dissertation, Jul. 15, 2013, 78 pages.

* cited by examiner

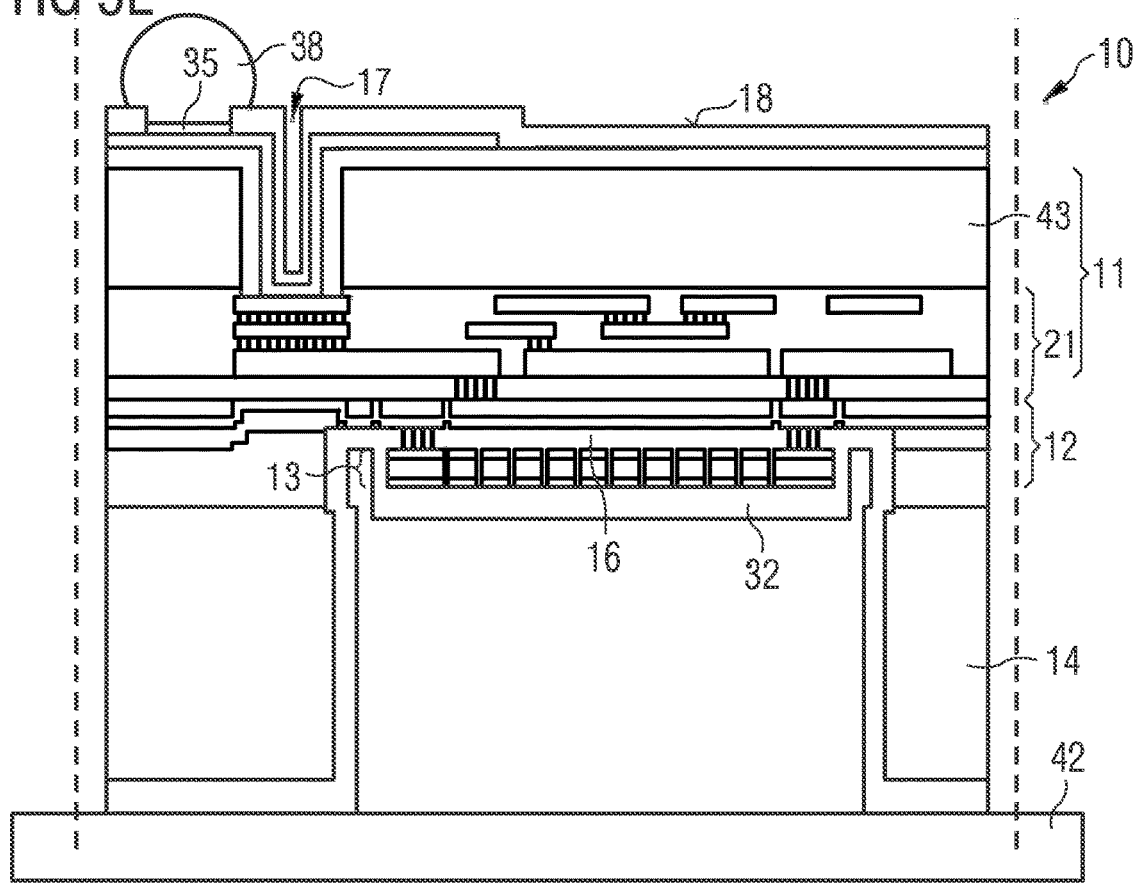
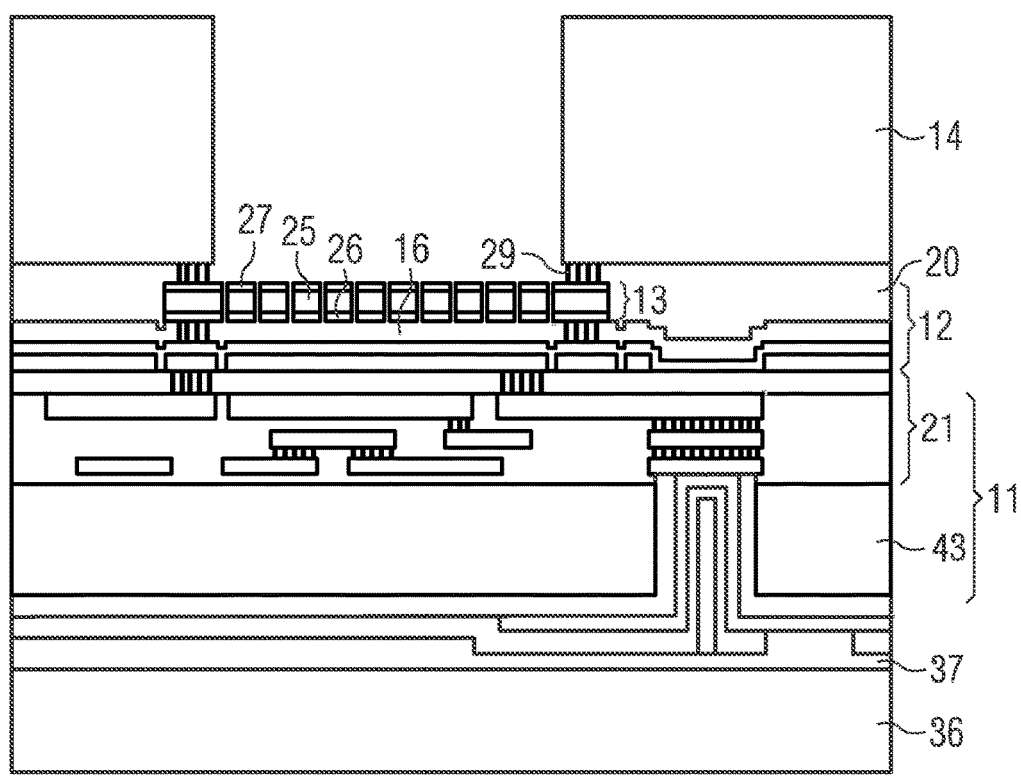

PRESSURE SENSOR DEVICE AND METHOD FOR FORMING A PRESSURE SENSOR DEVICE

The present application relates to a pressure sensor device and a method for forming a pressure sensor device.

BACKGROUND OF THE INVENTION

Pressure sensors are sensitive to stress and therefore need to be protected from undesired stress which can be caused, for example, by mechanical deformation. If a pressure sensor is arranged on a chip stress can be induced due to different coefficients of thermal expansion of different parts of the chip. Also, if the processing of the pressure sensor involves heating and solidification steps, additional stress can be exerted on the pressure sensor. As another example, if a pressure sensor is arranged within a device, mechanical forces of the device can occur and induce stress on the pressure sensor. It is desirable to maintain the conditions of the calibration of the pressure sensor, this means additional stress should be avoided in order to guarantee a correct pressure reading of the pressure sensor.

Additional stress induced on a pressure sensor can be avoided, for example, by the use of compliant layers which can be silicone-based. Such layers can be employed in land grid array packages. However, the use of compliant layers increases the total thickness of the device and the packages of the device are usually larger than the footprint of the pressure sensor.

SUMMARY OF THE INVENTION

The present disclosure provides a pressure sensor device with an increased accuracy in pressure sensing. It further provides a method for forming such a pressure sensor device with an increased accuracy.

In one embodiment of the pressure sensor device, the pressure sensor device comprises a substrate body. The substrate body can be a wafer, a substrate or bulk material and it can comprise silicon or glass. The substrate body can comprise a complementary metal oxide semiconductor device and a substrate. The pressure sensor device further comprises a pressure sensor comprising a membrane. The pressure sensor is arranged on top of the substrate body, for example on top of the complementary metal oxide semiconductor device. The pressure sensor can also comprise a cavity below the membrane.

In one embodiment, the pressure sensor device comprises a cap body comprising at least one opening. The cap body can comprise silicon or glass and can be of the same material as the substrate body. It is also possible that the cap body and the substrate body comprise different materials. The cap body and the substrate body can comprise materials with similar coefficients of thermal expansion. The cap body can be a wafer, a substrate or a bulk material which is arranged on top of the pressure sensor. This means the cap body is arranged on the side of the pressure sensor which faces away from the substrate body. The opening in the cap body can be formed by deep reactive ion etching in combination with grinding. The diameter or a lateral extension of the opening can, for example, amount to approximately 800 µm. Advantageously, the diameter or the lateral extension of the opening is small in comparison to the lateral extension of the cap body.

In one embodiment of the pressure sensor device, the pressure sensor is arranged between the substrate body and the cap body in a vertical direction which is perpendicular to the main plane of extension of the substrate body and the mass of the substrate body equals approximately the mass of the cap body. The main plane of extension of the substrate body extends in a lateral direction of the substrate body. The thickness of the substrate body is given in the vertical direction and the thickness of the substrate body is small in comparison to the lateral extension of the substrate body. This means, the vertical direction corresponds to a stacking direction of the pressure sensor device. This means, the pressure sensor is arranged on top of the substrate body in stacking direction and the cap body is arranged on top of the pressure sensor in stacking direction. The mass of the substrate body can, for example, amount to at least 80% of the mass of the cap body and at most 120% of the mass of the cap body. Optionally, the mass of the substrate body can amount to at least 90% of the mass of the cap body and at most 110% of the mass of the cap body. Optionally, the mass of the substrate body can amount to at least 95% of the mass of the cap body and at most 105% of the mass of the cap body. This means, the masses of the substrate body and the cap body are approximately equal within a tolerance of manufacturing.

If the masses of the substrate body and the cap body are approximately equal, the pressure sensor or the membrane of the pressure sensor are located in a plane of minimal mechanical stress change when subjected to externally applied, mechanical or thermal induced deformations. This means, there is a plane of minimal stress within the device. Advantageously, the membrane of the pressure sensor is located in the plane of minimal stress within the pressure sensor device.

The cap body can be patterned before it is attached on the pressure sensor and the substrate body. For example, a recess can be formed in the cap body so that the cap body is not in direct contact with the membrane of the pressure sensor. In order to keep the masses of the substrate body and the cap body approximately equal, the cap body needs to be thicker than the substrate body because of the opening in the cap body. The opening of the cap body can have a lateral extension of approximately one third of the lateral extension of the cap body. In this case, the cap body needs to be thicker than the substrate body in order to position the pressure sensor in the plane of minimal stress of the pressure sensor device. It is also possible that the lateral extension of the opening of the cap body is larger than the lateral extension of the membrane of the pressure sensor. Therefore, the thickness of the cap body depends on the lateral extension of the opening in the cap body.

If the substrate body is transparent for light or electromagnetic radiation, an optical sensor can advantageously be integrated in the device next to the pressure sensor.

By positioning the pressure sensor in the plane of minimal stress, it is protected against strain which can be caused, for example, by different coefficients of thermal expansion of the pressure sensor device and an underlying printed circuit board on which the pressure sensor is mounted. The pressure sensor can also be protected against additional stress induced from other parts of the pressure sensor device or the surroundings of the pressure sensor device. If the additional stress on the pressure sensor is minimized by placing the pressure sensor in the plane of minimal stress, the pressure sensor can operate under the same conditions as during the calibration of the pressure sensor, thus guaranteeing a correct and more accurate pressure reading.

Furthermore, by positioning the cap body on top of the pressure sensor, the thickness of the pressure sensor device is increased such that the substrate body can be thin enough to allow a processing from a bottom side of the substrate body, where the bottom side of the substrate body faces away from the pressure sensor. This means that through silicon vias can be etched in the substrate body to electrically contact the pressure sensor from the backside of the pressure sensor facing away from the cap body. Moreover, it is possible to release the membrane of the pressure sensor after the processing steps which can comprise the etching of the through silicon vias which avoids a potential membrane fracture during the processing steps. Additionally, the employment of a cap body and a substrate body allows an efficient packaging of the pressure sensor since no compliant or glue layers are required for the decoupling of the membrane. Therefore, the thickness of the packaging can be reduced and also the footprint of the packaging. The thickness of the packaging can for example amount to 300 to 600 μm and the footprint of the packaging can amount to 1 to 2 mm². Furthermore, the assembly costs of the packaging can be reduced.

In one embodiment the pressure sensor device comprises a substrate body, a pressure sensor comprising a membrane, and a cap body comprising at least one opening. The pressure sensor is arranged between the substrate body and the cap body in a vertical direction which is perpendicular to the main plane of extension of the substrate body, and the mass of the substrate body equals approximately the mass of the cap body.

In one embodiment of the pressure sensor device, the mass of the substrate body amounts to at least 95% of the mass of the cap body and at most 105% of the mass of the cap body. This means the masses of the cap body and the substrate body are approximately equal so that the pressure sensor is located in the plane of minimal stress of the pressure sensor device. It is also possible that the mass of the substrate body amounts to at least 80% of the mass of the cap body and at most 120% of the mass of the cap body. Optionally, the mass of the substrate body amounts to at least 90% of the mass of the cap body and at most 110% of the mass of the cap body.

In one embodiment of the pressure sensor device, the pressure sensor comprises a capacitive pressure sensor comprising a cavity below the membrane. The pressure sensor can be formed, for example, by providing a sacrificial layer above a bottom electrode and electrically conductive vias which are arranged around the area which is supposed to be the cavity of the pressure sensor. A top electrode can be deposited on top of the sacrificial layer and the electrically conductive vias, and the top electrode can be patterned to form the membrane. The sacrificial layer is etched away through etch holes in the membrane such that the cavity is formed below the membrane. The membrane can be sealed by plasma-enhanced chemical vapor deposition of silicon nitride, which can be silicon-rich, or silicon nitride and silicon oxide such that a compressive film is formed on top of the membrane. Advantageously, a compressive film is less permeable for gases from the surroundings into the cavity.

In one embodiment of the pressure sensor device, the substrate body comprises at least one vertical electrically conductive via and/or the pressure sensor device is surface mountable. Vertical in this case means along the vertical direction which means that the electrically conductive via extends from the bottom side of the substrate body which faces away from the pressure sensor in the direction of the pressure sensor. The electrically conductive via electrically contacts the pressure sensor or another electrical contact, for example a contact of a complementary metal oxide semiconductor device. The electrically conductive via can be a through silicon via which is formed by patterning of the substrate body, for example by etching. A trench patterned in the substrate body can be coated with an isolation material and with an electrically conductive material to contact the pressure sensor.

The electrically conductive material of the electrically conductive via can comprise titanium and/or titanium nitride and tungsten or tantalum and/or tantalum nitride and copper. In order to form the electrically conductive via in the substrate body, the substrate body can be thinned to, for example, 100 to 200 μm. Since the cap body is arranged on top of the pressure sensor, it is possible to thin the substrate body so that the electrically conductive via can be formed. With this, the pressure sensor device can be surface mountable. Surface mountable means that the pressure sensor device can be electrically contacted from the bottom side of the substrate body. The electrically conductive via can be electrically contacted on the bottom side of the substrate body by a solder ball.

In one embodiment of the pressure sensor device, the pressure sensor is positioned on top of an integrated circuit. The integrated circuit can be a complementary metal oxide semiconductor device. With this, the total size of the device can be reduced since the pressure sensor is arranged on top of the integrated circuit.

In one embodiment of the pressure sensor device, a top layer covers the pressure sensor on the side of the pressure sensor facing the cap body, and the top layer and the cap body are connected via direct bonding. The top layer can be deposited onto the pressure sensor before the membrane is released. The top layer can, for example, comprise a bond oxide and it can be, for example, 2 to 3 μm thick. The top layer can comprise silicon dioxide and/or silicon nitride. The advantages of direct bonding are that a very stiff connection can be formed between the cap body and the top layer and that the bond is compatible with high temperatures which can employed during the processing of the pressure sensor device.

For a stiff connection, it is important that the surface of the top layer is topographically flat. Therefore, the surface of the top layer can be flattened by chemical mechanical polishing before connecting with the cap body. A good mechanical coupling and stiffness of the connection between the top layer and the cap body is important for the stress compensation in the plane of the membrane of the pressure sensor. If the connection between the top layer and the cap body is not stiff enough, strain cannot be transferred to the cap body and the plane of minimal stress is less well defined. Therefore, the stiffness of the connection can also influence the required thicknesses of the cap body and the substrate body. It is also possible that the top layer and the cap body are connected via a glue.

If the top layer comprises a metal it can be connected with the cap body by eutectic bonding. A eutectic bond is a very stable bond and it is also stable at high temperatures. Therefore, in the case of eutectic bonding other processing steps, such as for example the formation of an electrically conductive via with tungsten in the substrate body, are possible.

In one embodiment of the pressure sensor device, the top layer comprises at least one electrically conductive wall which is arranged on top of the pressure sensor surrounding the opening and which is in direct contact with the pressure sensor and the cap body. The top layer can comprise one or more electrically conductive walls. The electrically conductive wall is arranged to protect the top layer against the etching of the cavity such that the top layer is not etched away where it is arranged between the cap body and the substrate body. This means the electrically conductive wall is arranged around the membrane of the pressure sensor and around the area where the cavity is etched. With this, it is avoided that the top layer is etched away below the cap body. Therefore, the electrically conductive wall can be formed before the membrane is released. The electrically conductive wall can also serve to stabilize the pressure sensor device.

In one embodiment of the pressure sensor device, the opening in the cap body is positioned above the pressure sensor in vertical direction and extends over the total lateral extension of the pressure sensor. The opening is introduced into the cap body so that the pressure sensor can measure the pressure of the surroundings of the pressure sensor device. Therefore, the membrane with a sealing needs to be in direct contact with the air or the gas from the surroundings of the pressure sensor device.

The lateral extension of the opening can be the same as the lateral extension of the pressure sensor or the lateral extension of the opening can be larger than the lateral extension of the pressure sensor. The lateral extension refers to an extension in two dimensions which are given by two directions which are perpendicular to the vertical direction. The opening can be shaped circular. It is also possible to introduce more than one opening in the cap body.

The cap body can be thinned before the opening is introduced. The thickness of the cap body depends on the size of the opening. This means if the lateral extension of the opening is small, the cap body can be thinner in order to keep the plane of minimal stress in the plane of the membrane.

In one embodiment of the pressure sensor device, the opening in the cap body is positioned above the pressure sensor in vertical direction and the lateral extension of the opening is smaller than the lateral extension of the pressure sensor. It is advantageous to keep the lateral extension of the opening small and, therefore, also the thickness of the cap body in order to reduce the total height of the pressure sensor device. It is also possible that the opening is not positioned above the membrane in vertical direction but besides the membrane in vertical direction.

Furthermore, a method for forming a pressure sensor device is provided. The pressure sensor device may be produced by means of one of the methods described here. This means all features disclosed for the pressure sensor device are also disclosed for the method for forming a pressure sensor device and vice-versa.

According to at least one embodiment of the method for forming a pressure sensor device, the method comprises providing a pressure sensor on a substrate body, the pressure sensor comprising a membrane, and depositing a top layer on top of the substrate body and the pressure sensor. The method further comprises connecting a cap body with the top layer, the mass of the cap body being approximately equal to the mass of the substrate body, and introducing at least one opening in the cap body.

The mass of the substrate body can, for example, amount to at least 95% of the mass of the cap body and at most 105% of the mass of the cap body. It is also possible that the mass of the substrate body amounts to at least 80% of the mass of the cap body and at most 120% of the mass of the cap body. Optionally, the mass of the substrate body amounts to at least 90% of the mass of the cap body and at most 110% of the mass of the cap body. This means, the masses of the substrate body and the cap body are approximately equal within a tolerance of manufacturing, such that the pressure sensor is positioned in the plane of minimal stress.

The pressure sensor can be a capacitive pressure sensor with a membrane and a cavity. The substrate body can comprise silicon or glass, and it can also comprise a complementary metal oxide semiconductor device. The top layer can be a bond oxide, for example silicon dioxide or silicon nitride, which needs to be topographically flat. The cap body and the top layer can be connected by direct bonding, via gluing or via eutectic bonding. The opening can be introduced in the cap body by deep reactive ion etching or by grinding. It is also possible that the cap wafer is patterned before connecting with the top layer, for example with a recess for the membrane so that the cap body is not in direct contact with the membrane.

By positioning the pressure sensor in the plane of minimal stress, it is protected against strain which can be caused, for example, by different coefficients of thermal expansion of the cap body and the substrate body. The pressure sensor can also be protected against additional stress induced from other parts of the pressure sensor device or the surroundings of the pressure sensor device. If the additional stress on the pressure sensor is minimized by placing the pressure sensor in the plane of minimal stress, the pressure sensor can operate under the same conditions as during the calibration of the pressure sensor, thus guaranteeing a correct and more accurate pressure reading.

According to at least one embodiment of the method for forming a pressure sensor device, the mass of the substrate body amounts to at least 95% of the mass of the cap body and at most 105% of the mass of the cap body. It is also possible that the mass of the substrate body amounts to at least 80% of the mass of the cap body and at most 120% of the mass of the cap body. Optionally, the mass of the substrate body amounts to at least 90% of the mass of the cap body and at most 110% of the mass of the cap body. This means the masses of the cap body and the substrate body are approximately equal so that the pressure sensor is located in the plane of minimal stress of the pressure sensor device.

According to at least one embodiment of the method for forming a pressure sensor device, a handling wafer is connected to the substrate body at the bottom side of the substrate body by an adhesive material which can be removed. Furthermore, the handling wafer and the adhesive material are removed. The handling wafer can be connected to the substrate body in order to protect electrically conductive vias in the substrate body from mechanical damage or damage from an etching step. For example, during the thinning of the cap body or the etching of the opening, electrically conductive vias in the substrate body can be protected by the handling wafer. The adhesive material can be high-temperature compatible and it can be removed. These features are advantageous for the processing of the pressure sensor device since in some processing steps, high temperatures can be required. If only lower temperatures are required during processing, it is also possible to employ a temporary bonding or tape as the adhesive which is compatible only to low temperatures and which can be removed.

According to at least one embodiment of the method for forming a pressure sensor device, a handling wafer is connected to the substrate body at the bottom side of the substrate body by an adhesive material which can be patterned. Furthermore, the handling wafer is removed and the adhesive material is not removed. Advantageously, the adhesive material is compatible with high temperatures. If the adhesive material cannot be removed, it is required that it can be patterned such that the pressure sensor and also, for example, a complementary metal oxide semiconductor device can be electrically contacted from the bottom side of the substrate body.

According to at least one embodiment of the method for forming a pressure sensor device, a vertical electrically conductive via is etched in the substrate body before the membrane is released. With the vertical electrically conductive via, the pressure sensor can be electrically contacted and also, for example, other devices in the pressure sensor device. If the vertical electrically conductive via is etched in the substrate body before the membrane is released, the membrane is protected by the sacrificial layer during the etching of the electrically conductive via and other processing steps. Therefore, potential membrane fracture during processing is avoided.

According to at least one embodiment of the method for forming a pressure sensor device, a vertical electrically conductive via is etched in the substrate body after the membrane is released. This means the membrane is released before further processing which can be the bonding of the cap wafer to the top layer. With this, it is possible to keep the opening in the cap body small since it is not required to etch the cavity through the opening of the cap body.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

Figure 4A:
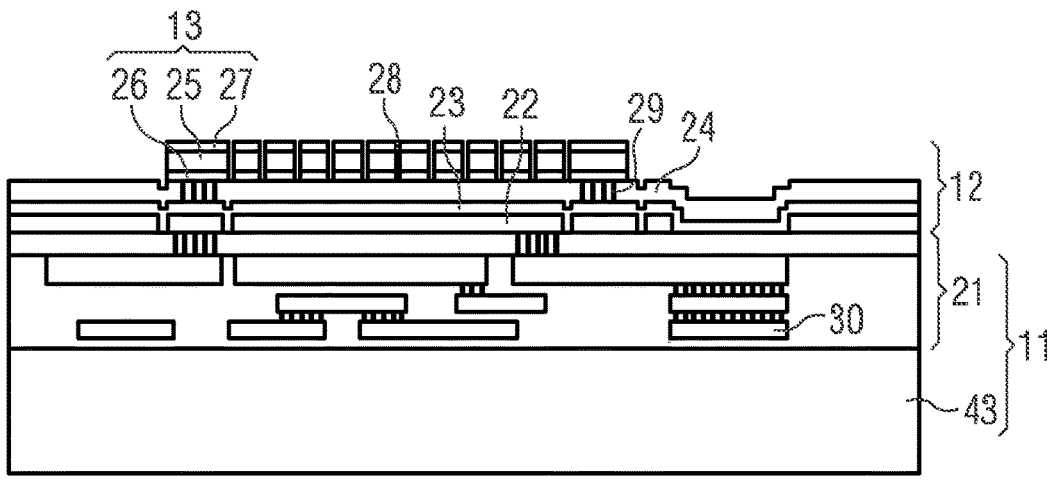
Figure 4B:
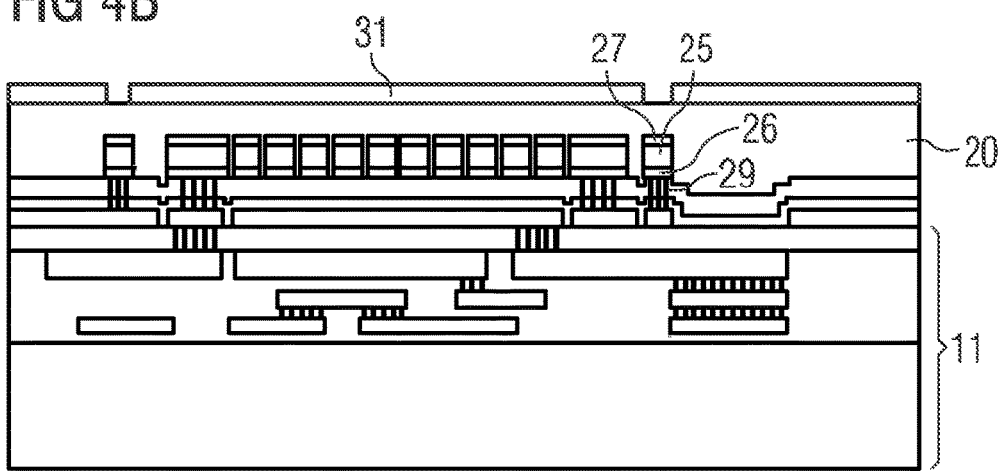
Figure 4C:
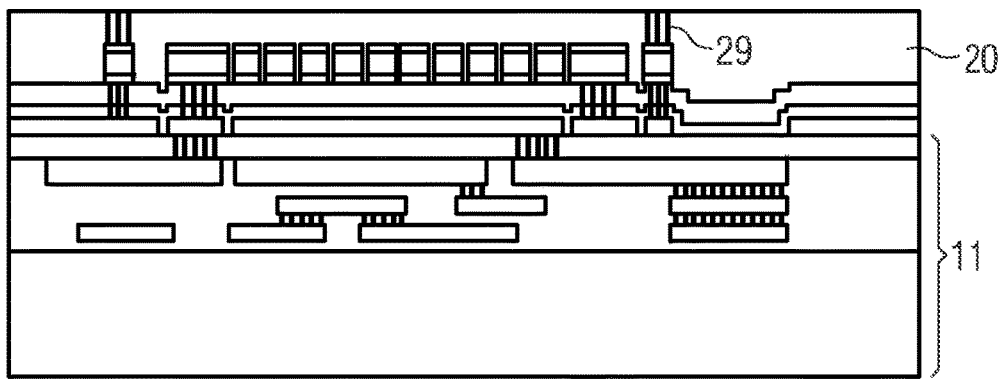
Figure 4D:
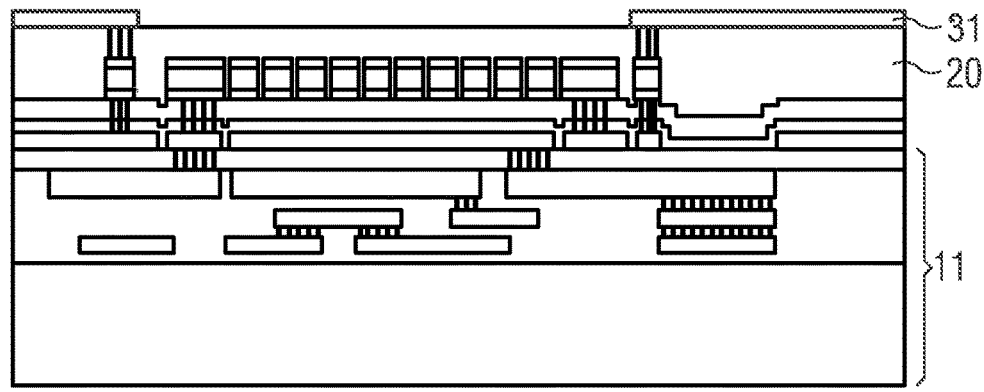
Figure 4E:
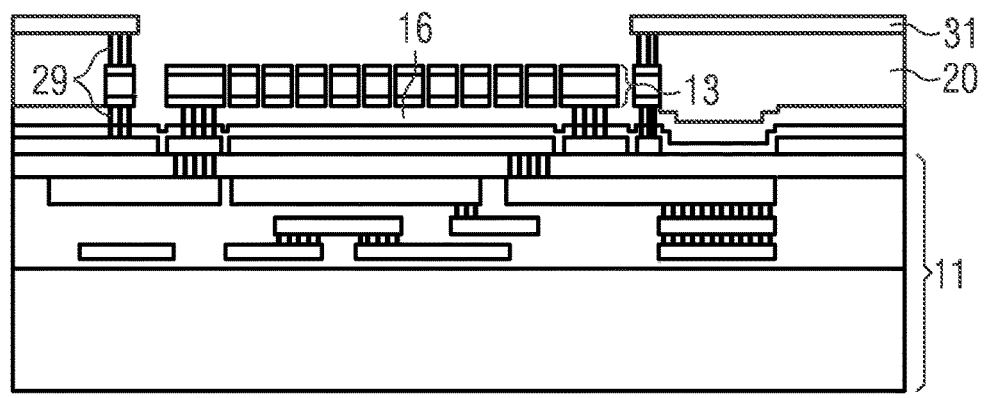
Figure 4F:
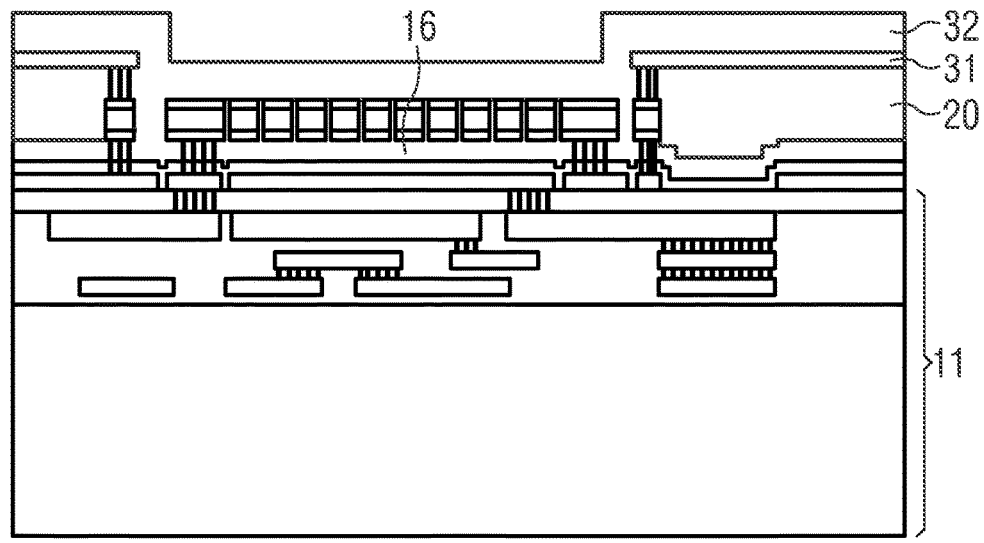
Figure 4G:
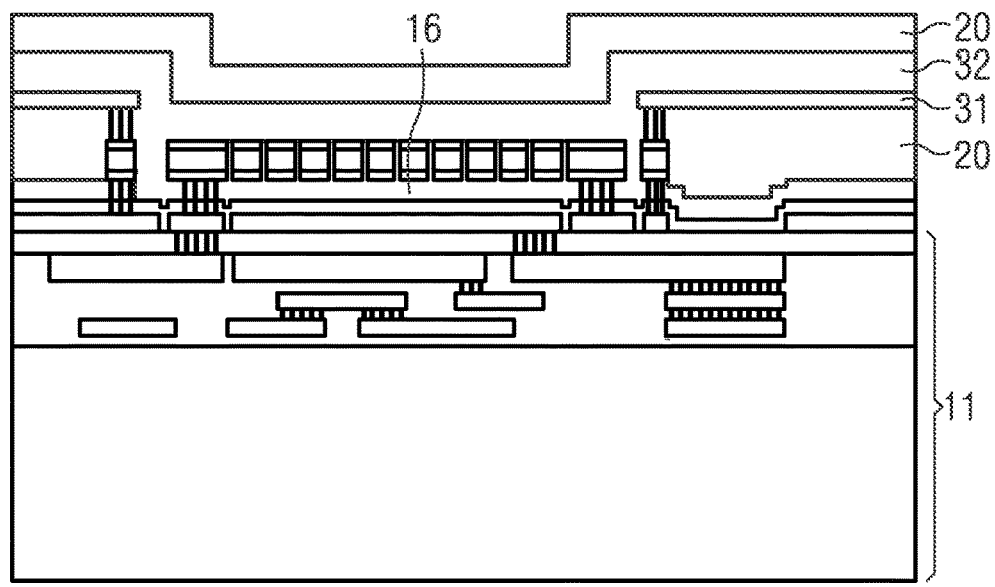
Figure 4H:
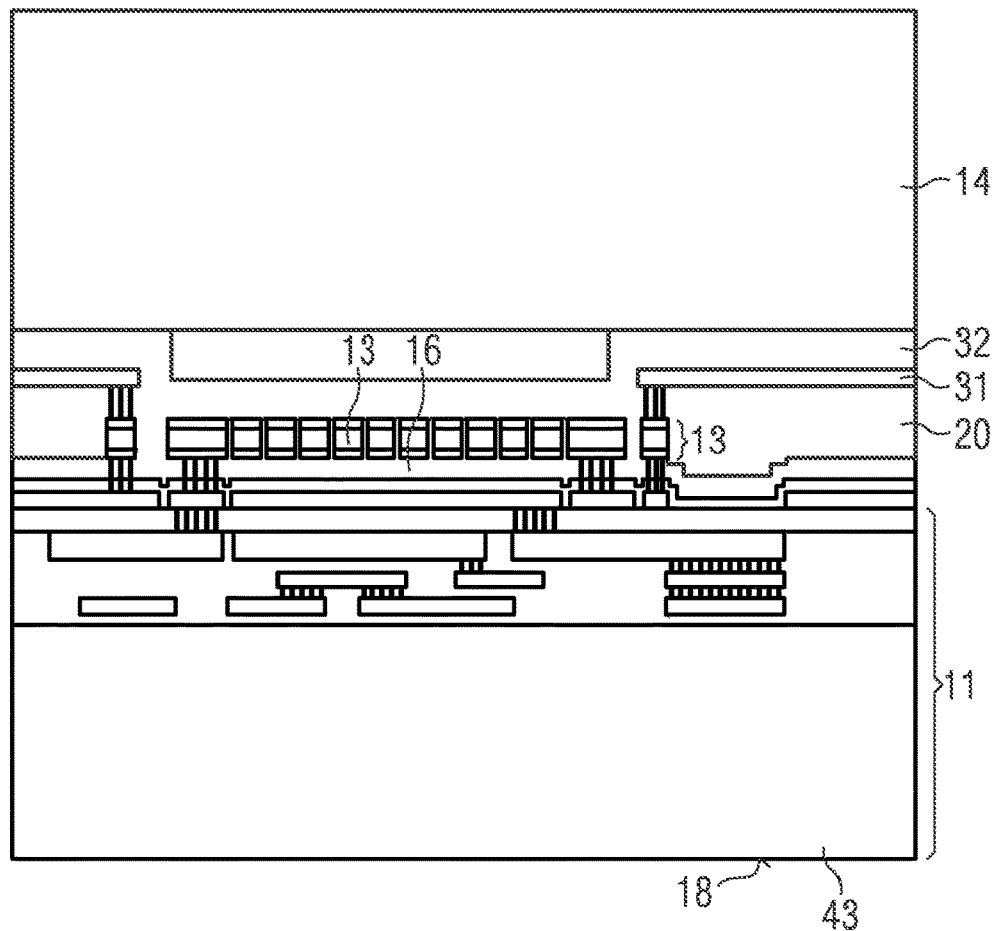
Figure 4I:
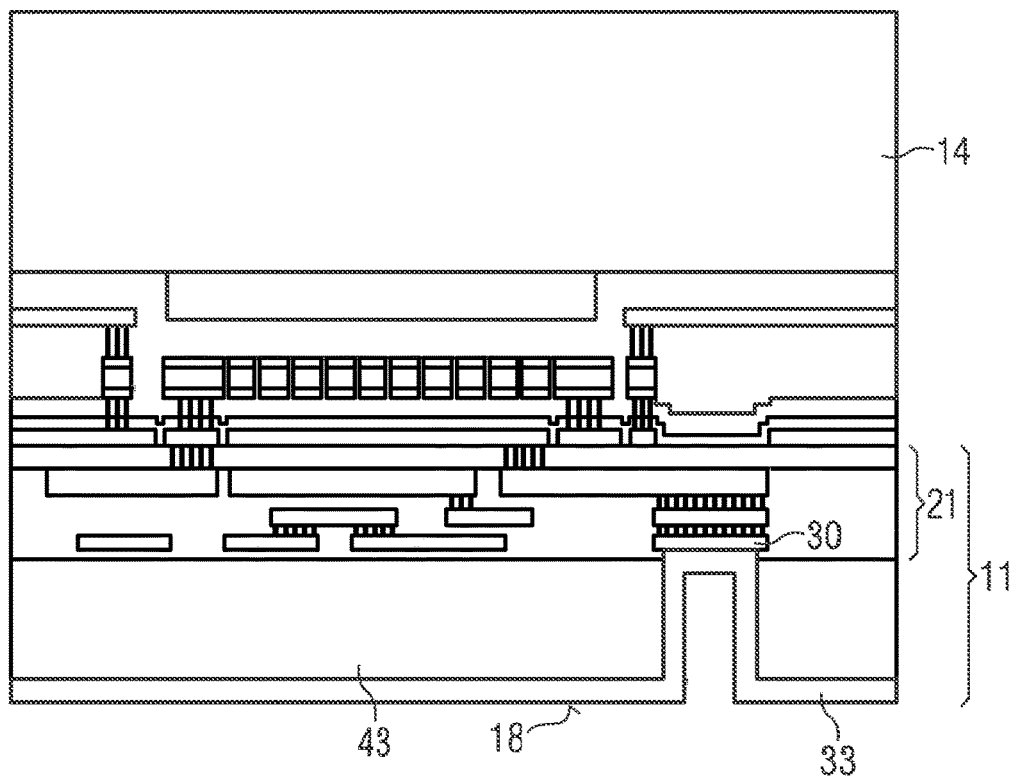
Figure 4J:
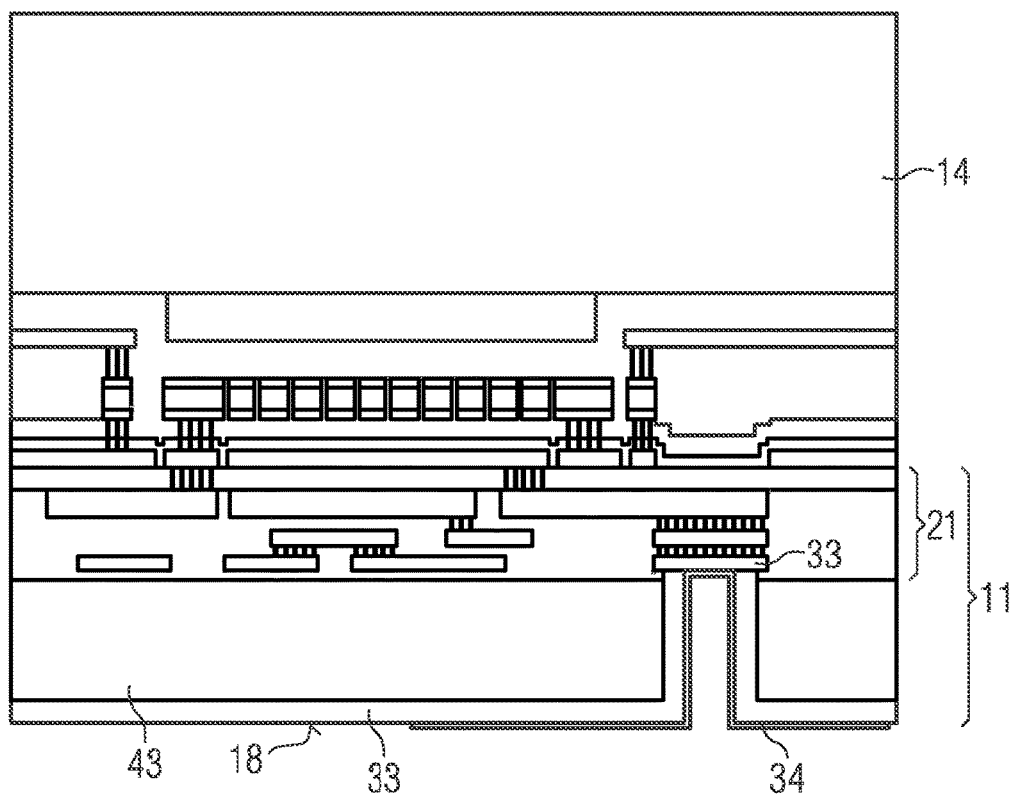
Figure 4K:
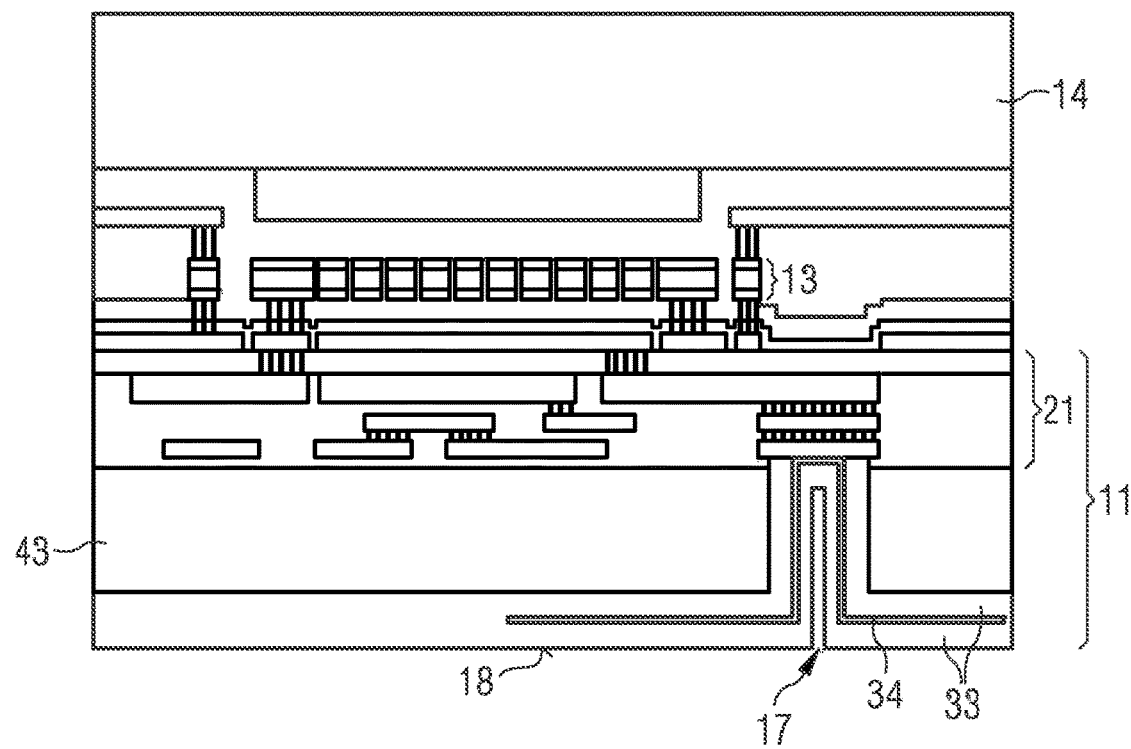
Figure 4L:
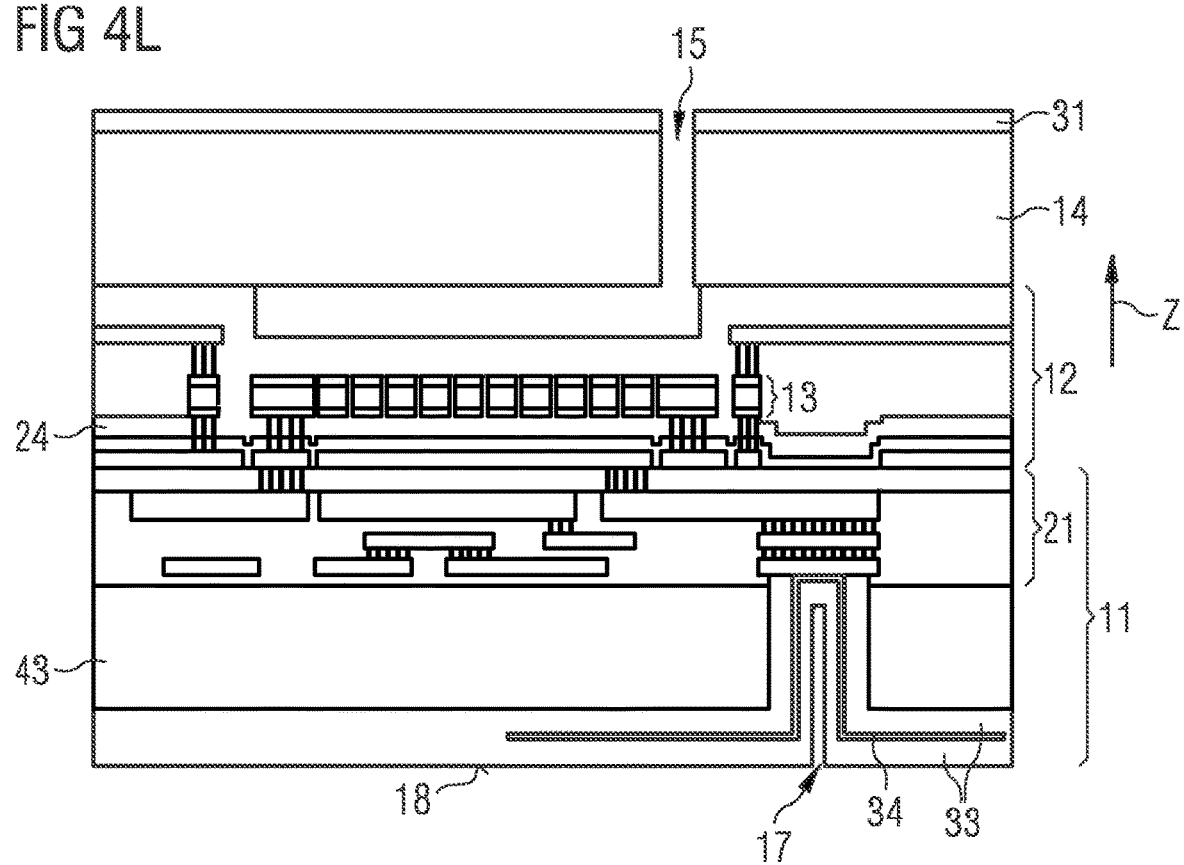
Figure 4M:
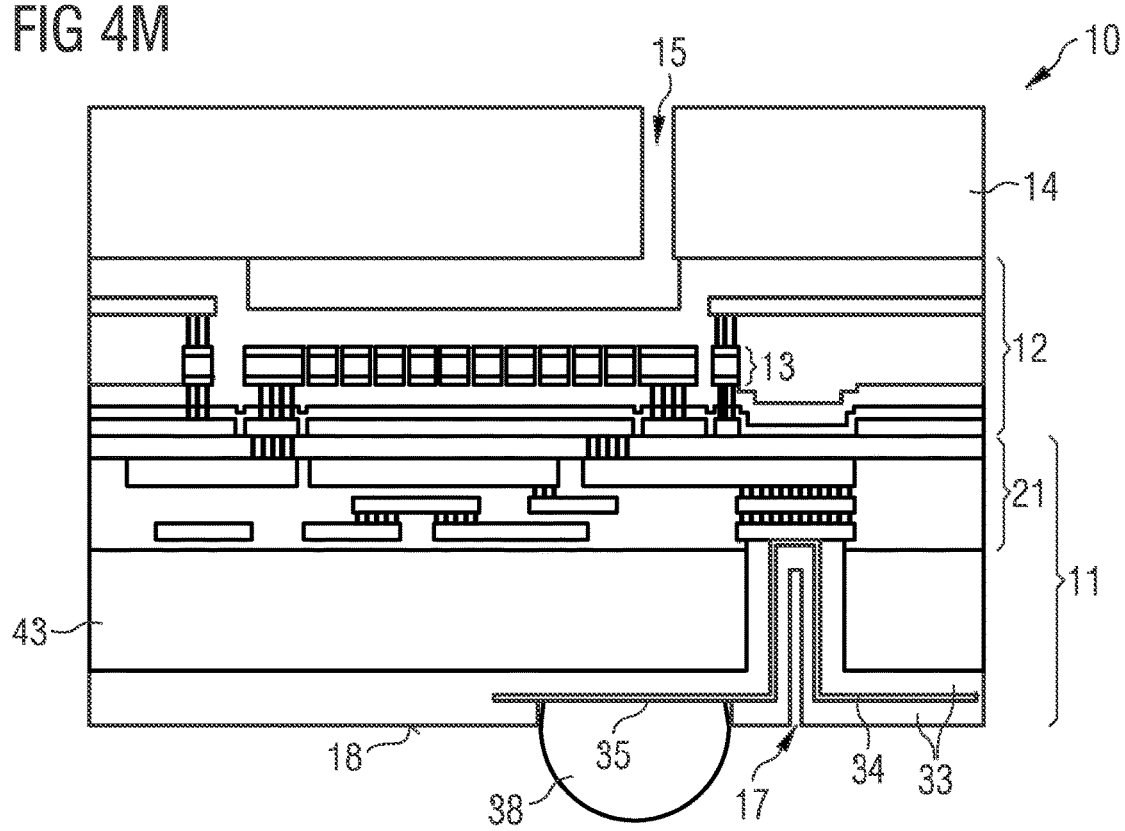
Figure 4N:
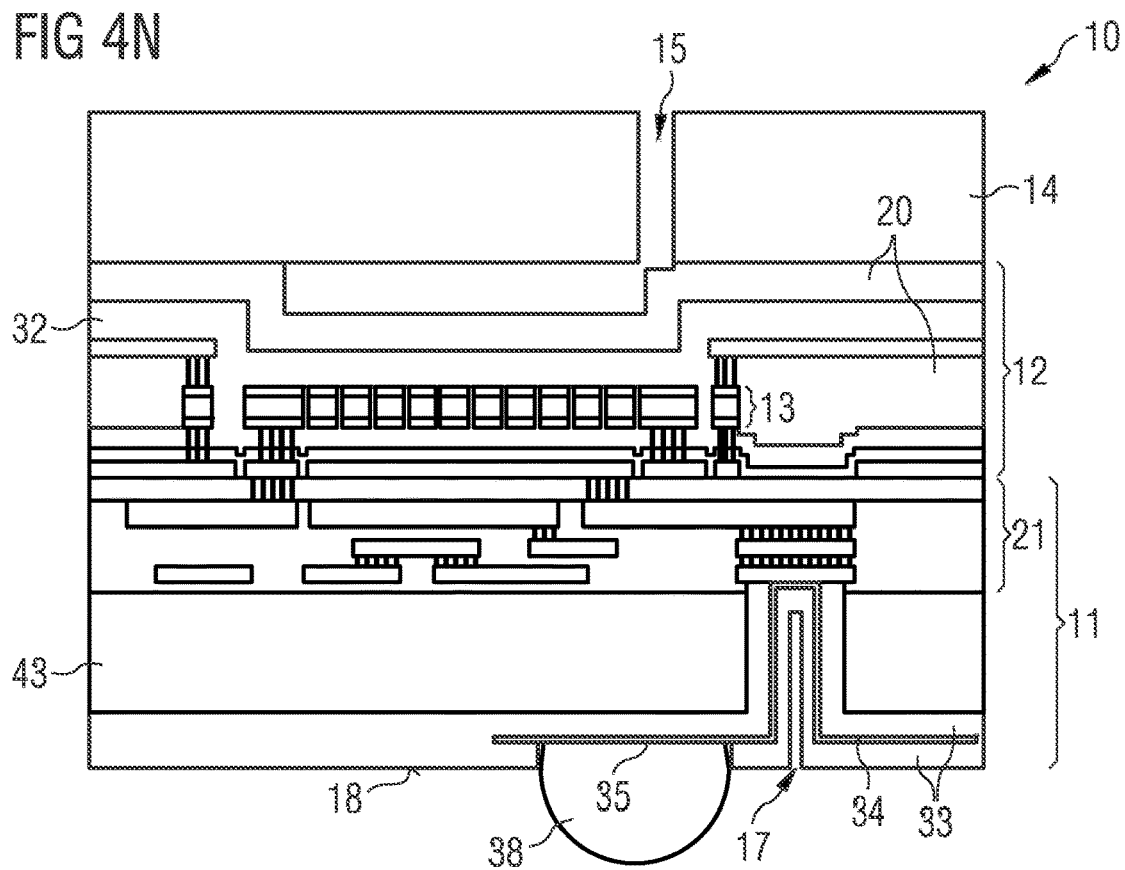
Figure 4O:
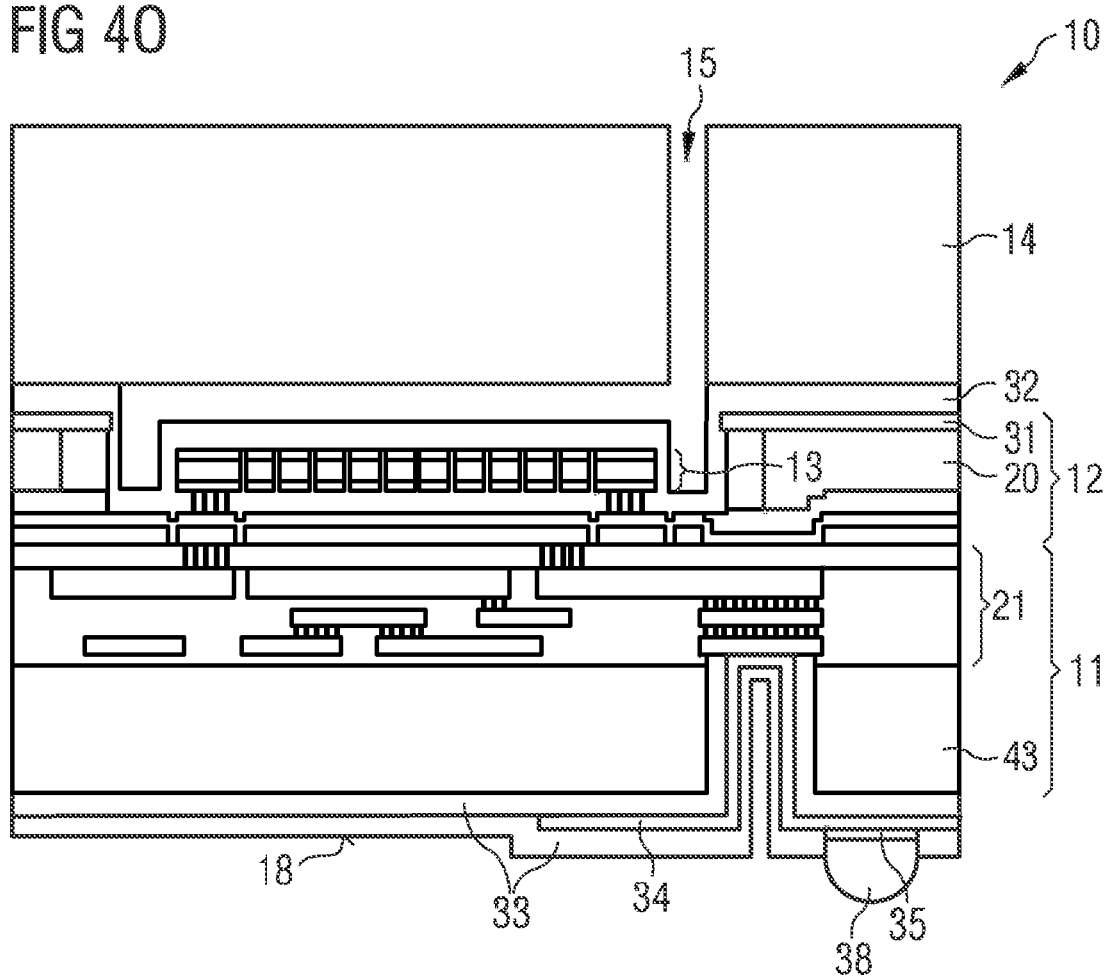

With FIGS. 4A to 4O an exemplary embodiment of the method for forming a pressure sensor device is described.

With FIGS. 5A to 5L another exemplary embodiment of the method for forming a pressure sensor device is described.

FIG. 6 shows an exemplary embodiment of the pressure sensor device with electrically conductive walls.

Figure 7:
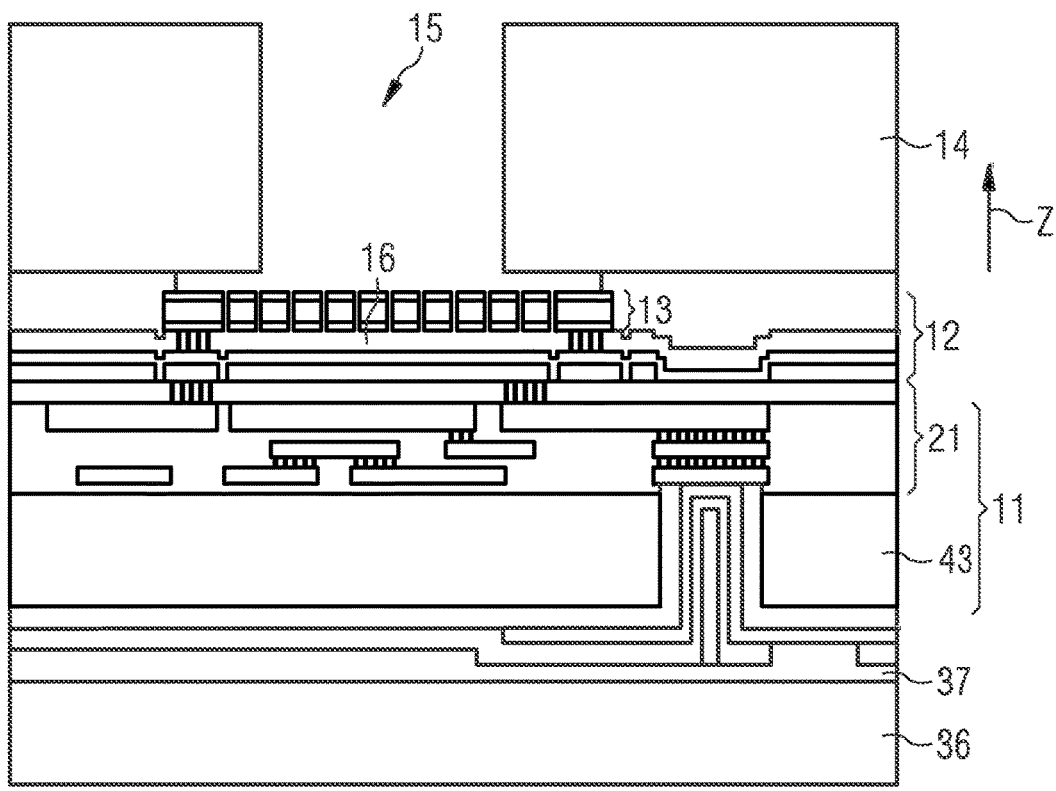

FIG. 7 shows an exemplary embodiment of the pressure sensor device with a reduced opening in the cap body.

Figure 8:
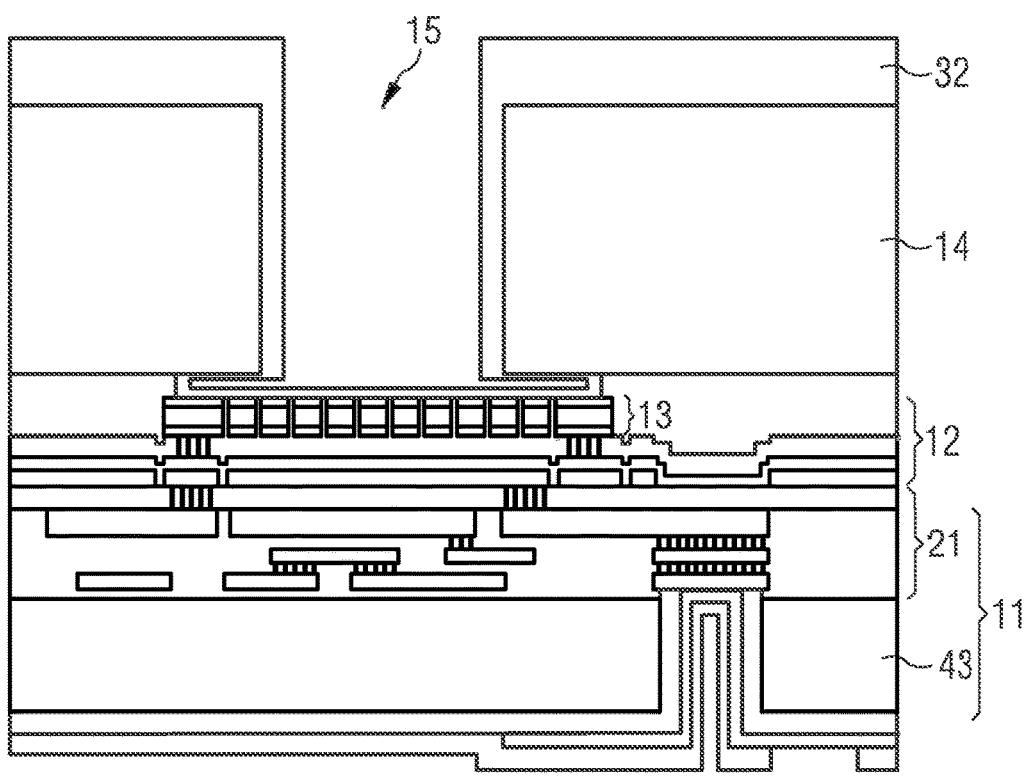
Figure 9:
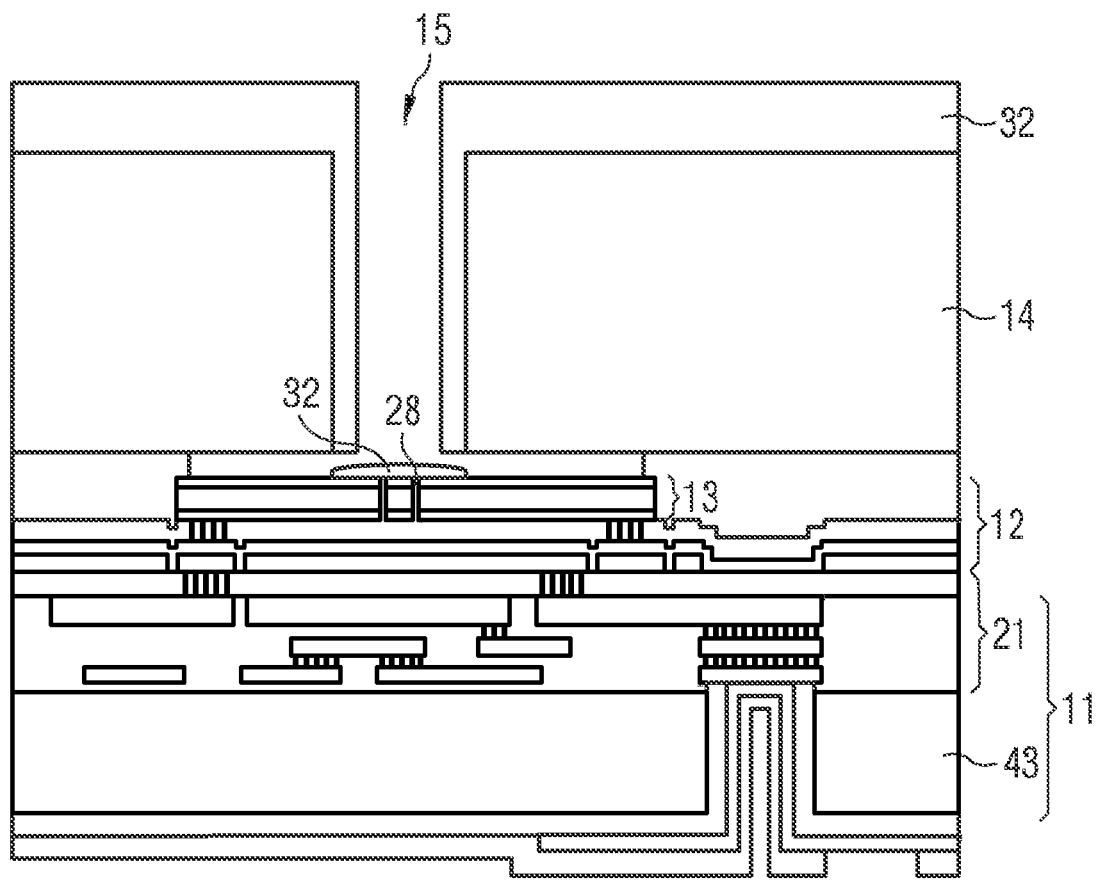

FIGS. 8 and 9 show exemplary embodiments of the pressure sensor device with a reduced opening in the cap body and a sealing on the membrane.

With FIGS. 10A to 10K another exemplary embodiment of a method for forming a pressure sensor device is described.

DETAILED DESCRIPTION

Figure 1:
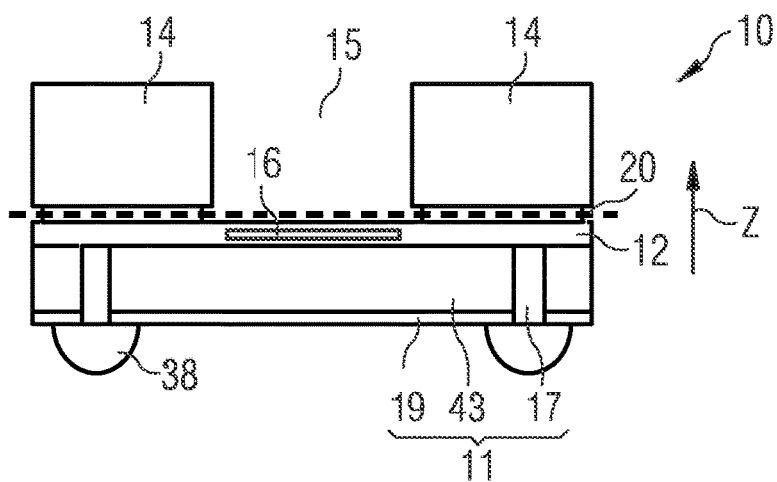
FIG. 1 shows a cutaway view of an exemplary embodiment of the pressure sensor device.

FIG. 1 shows a schematic cutaway view of an exemplary embodiment of the pressure sensor device 10 where the plane of minimal stress is indicated by the dashed line. On top of a substrate body 11 a pressure sensor 12 with a cavity 16 and a membrane 13 is arranged. The pressure sensor 12 is electrically contacted by two electrically conductive vias 17. The electrically conductive vias 17 extend through the substrate body 11 from a bottom side 18 of the substrate body 11 towards the pressure sensor 12. An isolation material 19 electrically isolates the electrically conductive vias 17 from each other and from the substrate body 11. On top of the pressure sensor 12 a top layer 20 is positioned which connects the pressure sensor 12 with a cap body 14. Thus, the pressure sensor 12 is arranged between the substrate body 11 and the cap body 14 in a vertical direction z. The cap body 14 and the top layer 20 can be connected via direct bonding. The cap body 14 comprises an opening 15 which is arranged above the pressure sensor 12. The plane of minimal stress is approximately located in the plane of the pressure sensor 12 and advantageously in the plane of the membrane 13 of the pressure sensor 12. In order to place the plane of minimal stress in the plane of the membrane 13 the mass of the substrate body 11 equals approximately the mass of the cap body 14. In other embodiments, this means for example that the mass of the substrate body 11 amounts to at least 95% of the mass of the cap body 14 and to at most 105% of the mass of the cap body 14.

Figure 2:
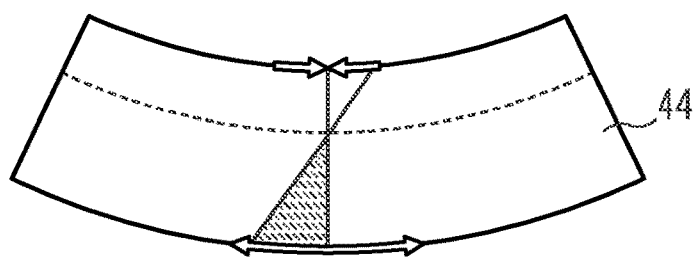
FIG. 2 shows a schematic cutaway view of a pressure sensor device on a printed circuit board.

FIG. 2 shows a schematic cutaway view of a pressure sensor device 10 mounted onto a printed circuit board. The pressure sensor device 10 with the printed circuit board is schematically depicted as one device body 44. Due to for example different coefficients of thermal expansion of the pressure sensor device and the printed circuit board, the device body 44 is bent in such a way that the top part is compressed and the bottom part experiences a tensile stress. The tensile and the compressive stresses are indicated by arrows. In one plane through the device body 44 the stress is minimal which is indicated by the dashed line.

Figure 3:
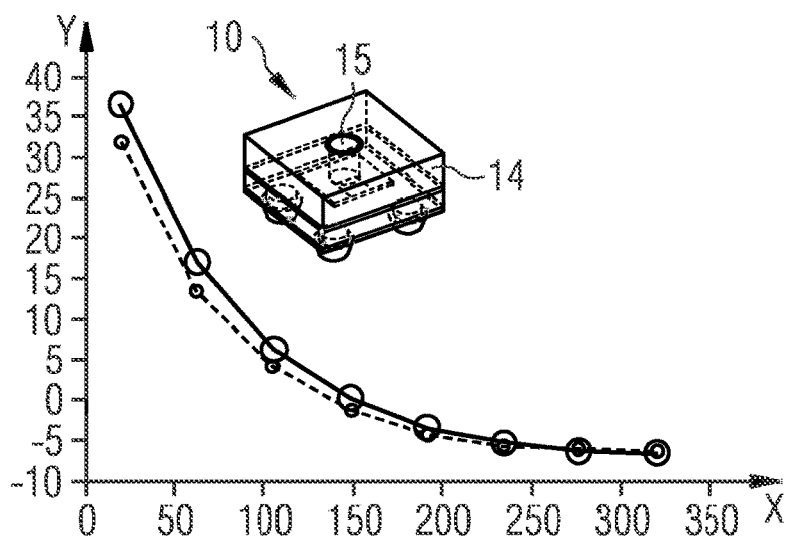
FIG. 3 shows the stress level as a function of cap body thickness.

FIG. 3 shows the stress level y as a function of cap body thickness x for a constant substrate body thickness. The additional stress is introduced on the pressure sensor device 10 by soldering the pressure sensor device 10 onto a printed circuit board. The optimal thickness x of the cap body 14 is at zero stress. The stress change is plotted for two different diameters of the opening 15 in the cap body 14. In the case of the straight line the diameter of the opening 15 amounts to 500 μm and in the case of the dashed line the diameter of the opening 15 amounts to 250 μm. The inset in FIG. 3 shows a schematic of a pressure sensor device 10 with the opening 15 in the cap body 14.

With FIGS. 4A to 4O an exemplary embodiment of the method for forming a pressure sensor device 10 is described. In the process flow described with FIGS. 4A to 4O the membrane 13 of the pressure sensor 12 is released before the electrically conductive via 17 is formed in the substrate body 11.

FIG. 4A shows the substrate body 11 which comprises an integrated circuit 21 which can be for example a complementary metal oxide semiconductor device. The integrated circuit 21 is arranged on top of a substrate 43 which is comprised by the substrate body 11 and which can comprise silicon. On top of the integrated circuit 21 the pressure sensor 12 is arranged. By arranging the pressure sensor 12 on top of the integrated circuit 21 instead of next to it, the footprint of the device is reduced. In this exemplary embodiment the pressure sensor 12 comprises a bottom electrode 22 on which a dielectric etch stop layer 23 is arranged. A sacrificial layer 24 is deposited on top of the dielectric etch stop layer 23. In order to form the cavity 16 of the pressure sensor 12, the sacrificial layer 24 is patterned in such a way that trenches are formed in the sacrificial layer 24. The trenches are filled with an electrically conductive material 34 as for example tungsten. In order to form the membrane 13, an electrically conductive layer 25 is deposited on top of the sacrificial layer 24. Below the electrically conductive layer 25 there is an adhesion layer 26 and there is another adhesion layer 27 on top of the electrically conductive layer 25. The electrically conductive layer 25 and the adhesion layers 26 and 27 comprise several etch openings 28. The bottom electrode 22 of the pressure sensor 12 is electrically connected with the integrated circuit 21 by electrically conductive walls 29. The integrated circuit 21 comprises a back contact 30.

As shown in FIG. 4B, in the next step of the method for forming a pressure sensor device 10, a top layer 20 is deposited on top of the pressure sensor 12. The top layer 20 can comprise a bond oxide and can be for example 2 to 3 μm thick. Furthermore, additional electrically conductive walls 29 are formed around the membrane 13. The further electrically conductive walls 29 are also connected by an electrically conductive layer 25 around which adhesion layers 26 and 27 are arranged. A mask 31 is positioned on top of the top layer 20 in order to pattern the top layer 20 above the additional electrically conductive walls 29.

In the next step of the method, as shown in FIG. 4C, the top layer 20 is patterned in such a way that electrically conductive walls 29 are formed around the membrane 13 in the top layer 20. The electrically conductive walls 29 can be filled with tungsten. After the deposition of the material of the electrically conductive walls 29 the surface of the top layer 20 is planarized for example by chemical mechanical polishing. In order to achieve a stiff connection between the top layer 20 and the cap body 14 it is necessary that the surface of the top layer 20 is topographically flat.

FIG. 4D shows that a mask 31 is positioned on the top layer 20. The mask 31 should be able to withstand an etching step with for example hydrogen fluoride vapor. In the next step, the mask 31 is patterned in such a way that the area above the membrane 13 on the pressure sensor 12 is free of the mask 31.

FIG. 4E shows that in the next step of the method the sacrificial layer 24 below and around the membrane 13 is etched away. With this, the membrane 13 of the pressure sensor 12 is released. Also, parts of the top layer 20 around the membrane 13 are etched away. The electrically conductive walls 29 and the additional electrically conductive walls 29 act as an etch stop so that not the whole top layer 20 is etched away.

As shown in FIG. 4F in the next step a sealing layer 32 is deposited on top of the membrane 13 and the mask 31. The sealing layer 32 can comprise silicon nitride. The sealing layer 32 is deposited at elevated temperatures as for example temperatures above 400° C. by plasma enhanced chemical vapor deposition, and therefore after cooling down the sealing layer 32 is compressive. With this, the sealing layer 32 is less permeable for gases from the surroundings into the cavity 16.

In FIG. 4G it is shown that another top layer 20 is deposited on top of the sealing layer 32. The other top layer 20 can also comprise a bond oxide. The other top layer 20 is deposited in order to improve the bonding strength between the top layer 20 and the cap body 14. The surface of the top layer 20 needs to be topographically flat in order to achieve a stiff connection to the cap body 14.

As shown in FIG. 4H in the next step of the method the cap body 14 is connected with the sealing layer 32. It is also possible that another top layer 20 is arranged between the sealing layer 32 and the cap body 14 in order to achieve a stiff connection. The cap body 14 are connected with the sealing layer 32 or the top layer 20 at elevated temperatures which could be for example around 450° C. As shown in FIG. 4H the sealing layer 32 on top of the membrane 13 is not in direct contact with the cap body 14. Therefore, the membrane 13 is still released and no additional stress is imposed on the membrane 13 from the cap body 14. With the cap body 14 being connected with the pressure sensor 12 and the substrate body 11, the pressure sensor device 10 is turned upside down and the substrate 43 is thinned to a required thickness by for example grinding. A required thickness of the substrate 43 can be 100 to 200 μm.

FIG. 4I shows that the substrate body 11 is patterned. This means a trench is formed in the substrate 43, for example by deep reactive ion etching. The trench extends through the whole substrate 43 in vertical direction z from the bottom side 18 to the integrated circuit 21. In a next step the oxide on the bottom of the integrated circuit 21 is also etched away such that the back contact 30 of the integrated circuit 21 can be electrically contacted. In the next step an isolation layer 33 is deposited on the bottom side 18 of the substrate body 11 and within the trench in the substrate 43.

As shown in FIG. 4J, in the next step of the method the isolation layer 33 is etched within the trench such that the back contact 30 of the integrated circuit 21 is free of the isolation layer 33. For etching the isolation layer 33 a mask 31 is employed. In the next step, an electrically conductive material 34 is deposited within the trench and around the trench on the bottom side 18 of the substrate body 11. The electrically conductive material 34 can be deposited by physical vapor deposition or by chemical vapor deposition. For example, the electrically conductive material 34 can comprise titanium, tantalum, tantalum nitride or copper. With a mask 31 applied on the bottom side 18 of the substrate body 11 the electrically conductive material 34 is patterned and etched away in such a way that a part of the bottom side 18 of the substrate body 11 is free of the electrically conductive material 34.

In FIG. 4K it is shown that in the next step of the method another isolation layer 33 is deposited on the bottom side 18 of the substrate body 11. With this, an electrically conductive via 17 is formed in the substrate 43. The cap body 14 is thinned in such a way that the masses of the substrate body 11 and the cap body 14 are approximately equal which means that the membrane 13 of the pressure sensor 12 is positioned in the plane of minimal stress of the pressure sensor device 10.

In FIG. 4L it is shown that a mask 31 is positioned on top of the cap body 14. With the mask 31 the cap body 14 is patterned in such a way that an opening 15 is formed in the cap body 14. The opening 15 is a trench through the whole cap body 14. In this case the opening 15 is positioned besides the membrane 13 on the pressure sensor 12 in a lateral direction. This means, the opening 15 extends in a vertical direction z, but it is not positioned directly above the membrane 13. Since the membrane 13 is already released, it is not required anymore to etch the sacrificial layer 24 and thus the opening 15 can be small and it is not necessary that the opening 15 is positioned directly above the membrane 13. If the opening 15 is small, the stress compensation within the pressure sensor device 10 is more well-defined than for a larger opening 15.

At next as shown with FIG. 4M a mask 31 is attached to the bottom side 18 of the substrate body 11 in order to etch a part of the isolation layer 33. With this, a part of the isolation layer 33 is etched in such a way that a part of the electrically conductive material 34 is free of the isolation layer 33. With this, a bottom contact 35 is formed at the bottom side 18 of the substrate body 11 where a solder ball 38 is soldered. Therefore, the pressure sensor device 10 is surface-mountable. As a last step, the pressure sensor device 10 is singulated by dicing.

FIG. 4N shows an exemplary embodiment of the pressure sensor device 10 processed by the method described with the FIGS. 4A to 4M with an additional top layer 20 on top of the sealing layer 32. In this case the lateral extent of the membrane 13 has to be large enough to enable pressure sensing with the thicker and stiffer membrane 13 because of the additional top layer 20 on top of the membrane 13.

FIG. 4O shows an exemplary embodiment of a pressure sensor device 10 processed by the method shown with the FIGS. 4A to 4M without additional electrically conductive walls 29. In this case a larger amount of the top layer 20 is etched away during the etching of the cavity 16. This reduces the stiffness of the connection between the cap body 14 and the substrate body 11 and it reduces the stability of the whole pressure sensor device 10.

With the FIGS. 5A to 5L another exemplary embodiment of the method for forming a pressure sensor device 10 is described. In this process flow the electrically conductive via 17 is formed in the substrate 43 before the membrane 13 is released.

Figure 5A:
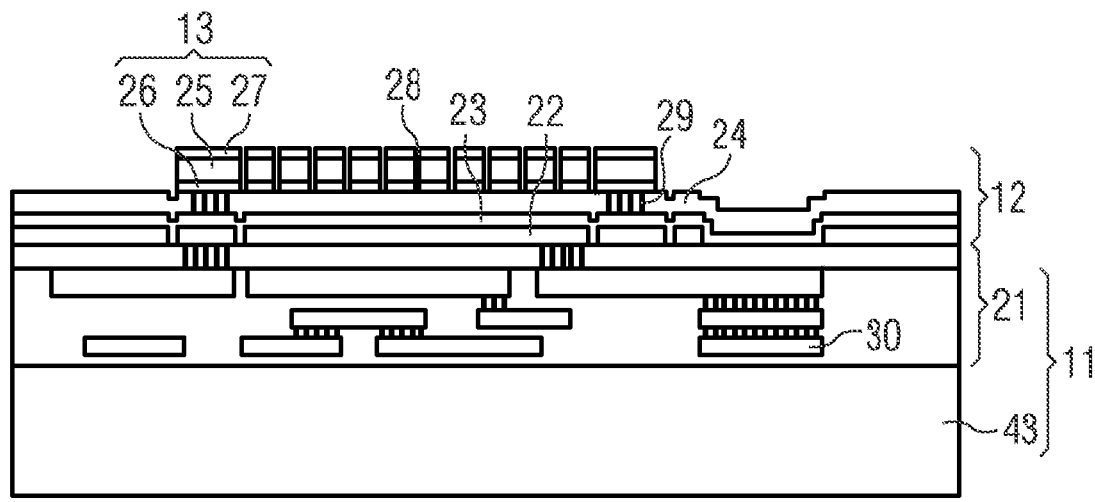

FIG. 5A shows the pressure sensor 12 on top of the substrate body 11 as described for FIG. 4A.

Figure 5B:
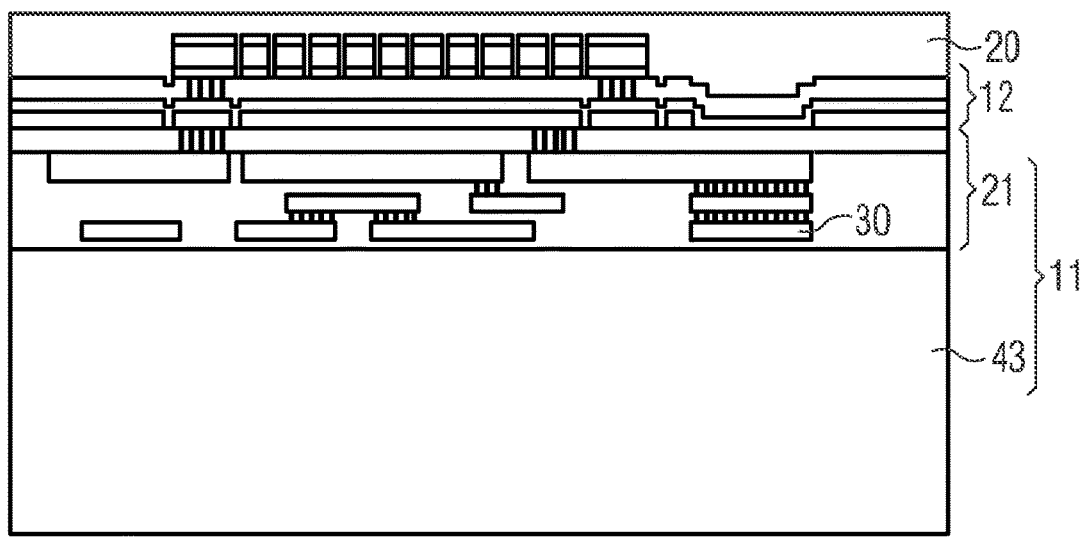

FIG. 5B shows the deposition of the top layer 20 on top of the pressure sensor 12 as described for FIG. 4B.

Figure 5C:
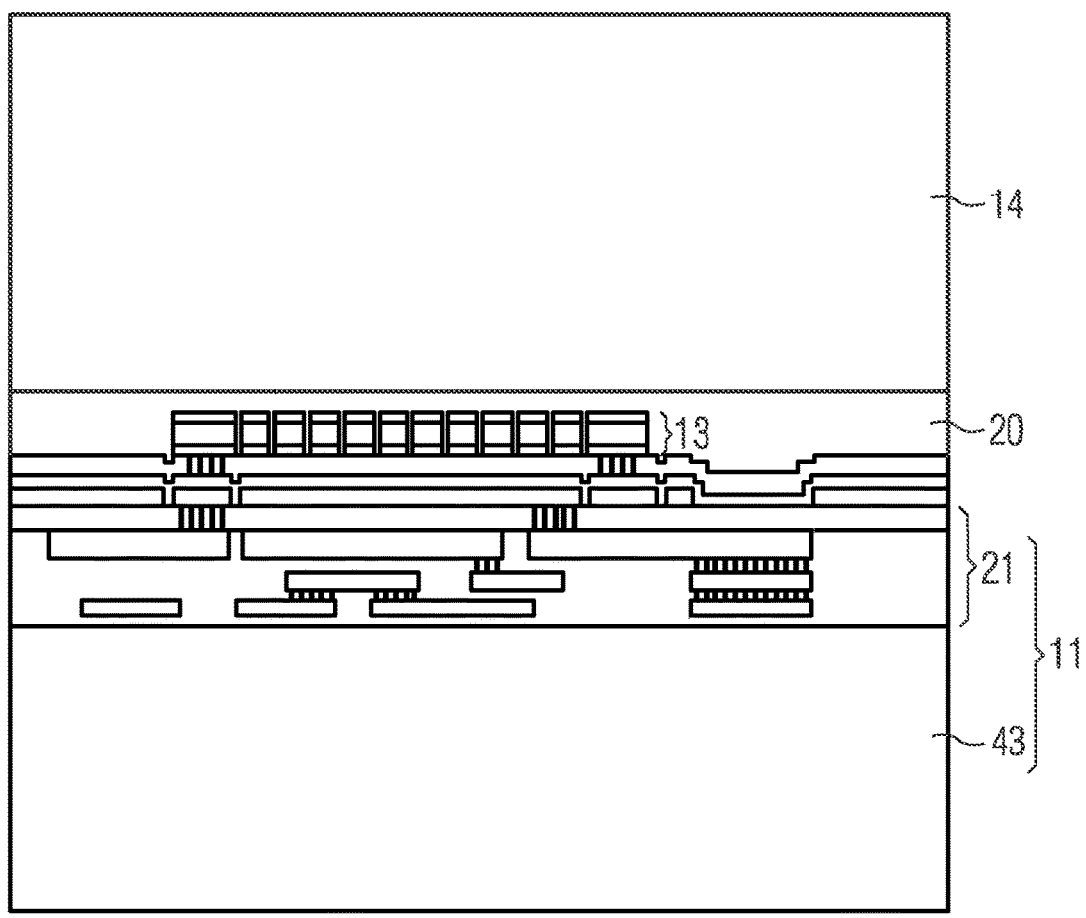

In FIG. 5C it is shown that in the next step of the method the cap body 14 is connected with the top layer 20. The cap body 14 and the top layer 20 are for example connected via direct bonding. Advantageously, the connection is stable at elevated temperatures, so that it is possible to deposit a final passivation or a sealing layer 32 on the membrane 13 in order to hermetically seal the membrane 13.

Figure 5D:
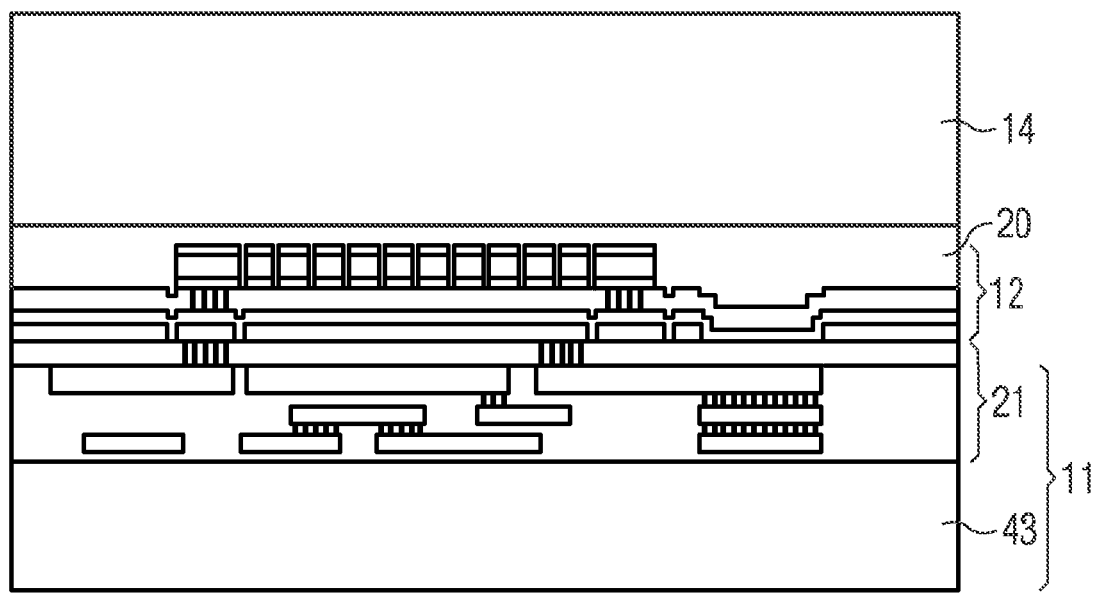

As shown in FIG. 5D the substrate 43 is thinned to for example 100 to 200 µm via grinding. The substrate 43 is thinned in order to introduce an electrically conductive via 17 in the substrate 43.

Figure 5E:
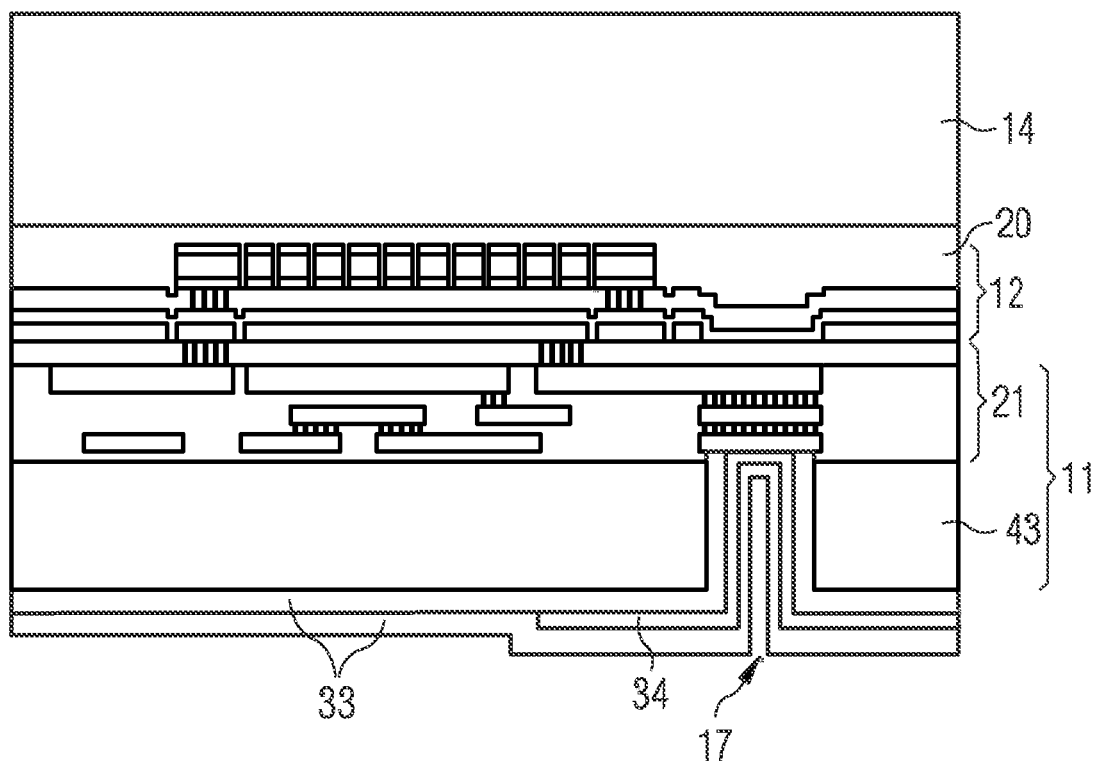

In the next step of the method as shown in FIG. 5E an electrically conductive via 17 is formed in the substrate 43. The electrically conductive via 17 comprises two isolation layers 33 and an electrically conductive material 34.

Figure 5F:
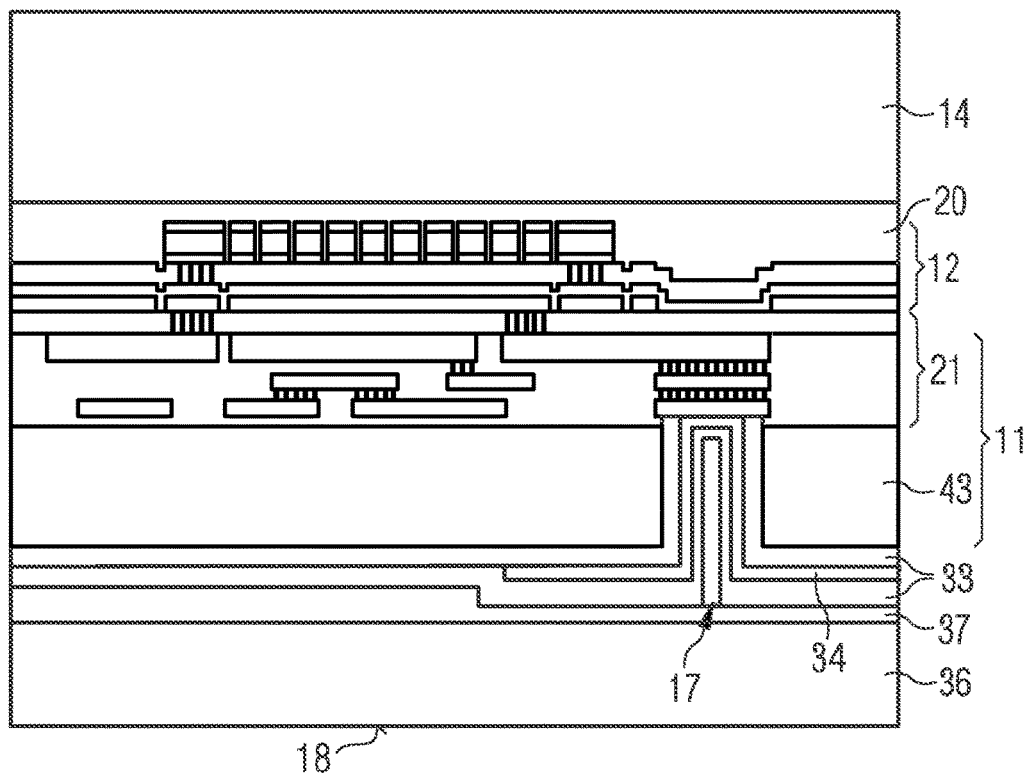

In FIG. 5F it is shown that in the next step of the method, a temporary handling wafer 36 is attached to the substrate 43 with an adhesive 37. By attaching a temporary handling wafer 36 to the bottom side 18 of the substrate body 11, the electrically conductive via 17 is protected from etching processes and mechanical damages. Therefore, advantageously the handling wafer 36 is only removed after the membrane 13 is released. The electrically conductive via 17 is also protected during grinding or etching of the cap body 14. If the pressure sensor device 10 is heated to elevated temperatures during the further processing, the adhesive 37 can be a high temperature compatible material which is removed after the processing. It is also possible that the adhesive 37 is a high temperature compatible material which remains on the substrate body 11. However, in this case the adhesive 37 needs to be patterned in such a way that the electrically conductive via 17 can be electrically contacted from the bottom side 18 of the substrate body 11. If only lower temperatures are employed during the further processing the adhesive 37 can be a bonding or a tape which is compatible only with lower temperatures and which can be removed. It is also possible to employ a permanent bonding.

Figure 5G:
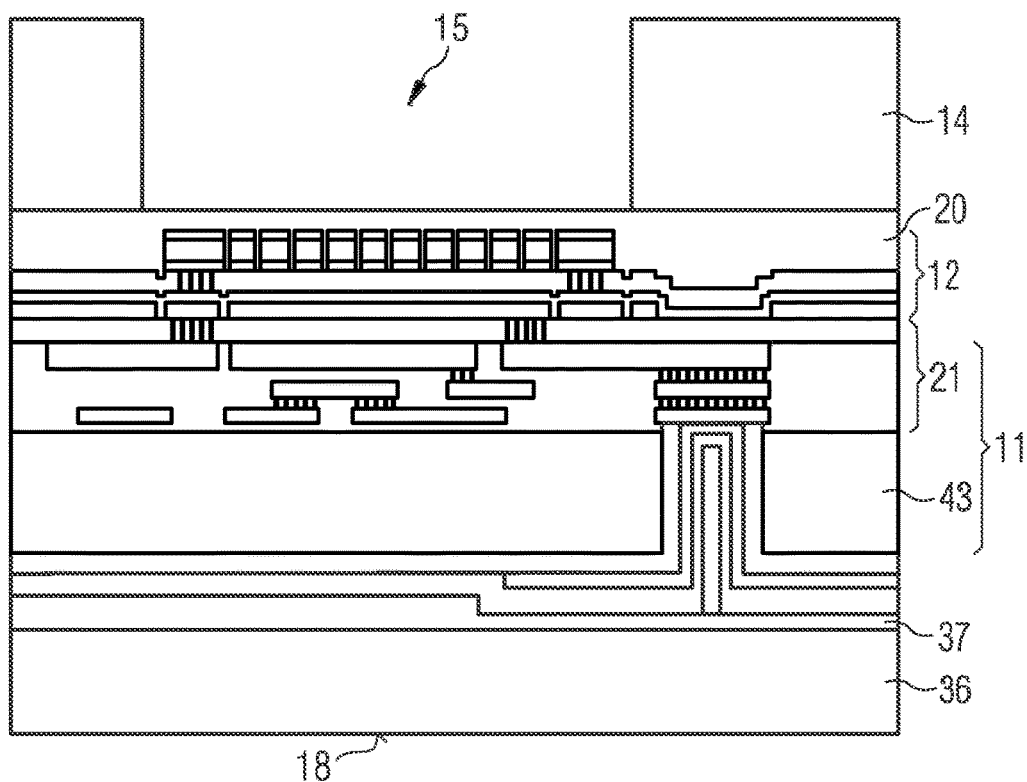

FIG. 5G shows that in the next step of the method the opening 15 is introduced in the cap body 14. Before introducing the opening 15, the cap body 14 is thinned. The opening 15 can be introduced by deep reactive ion etching of the cap body 14.

Figure 5H:
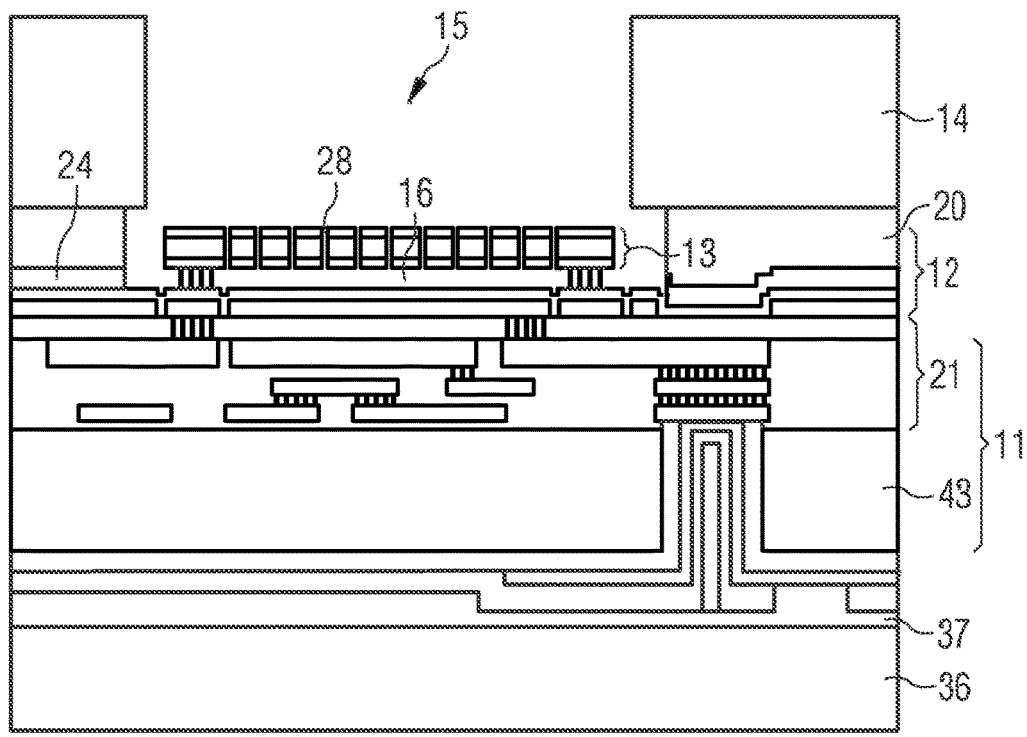

In FIG. 5H it is shown that the membrane 13 of the pressure sensor 12 is released. As described for FIG. 4E, the sacrificial layer 24 and the top layer 20 are etched away through the opening 15 and the etch openings 28. Since no additional electrically conductive walls 29 are introduced in the top layer 20 a part of the top layer 20 is also etched away below the cap body 14. Preferably, the lateral distance that the top layer 20 is etched below the cap body 14 is less than 10 µm. After etching the pressure sensor device 10 is annealed at an elevated temperature in order to remove all residues and water.

Figure 5I:
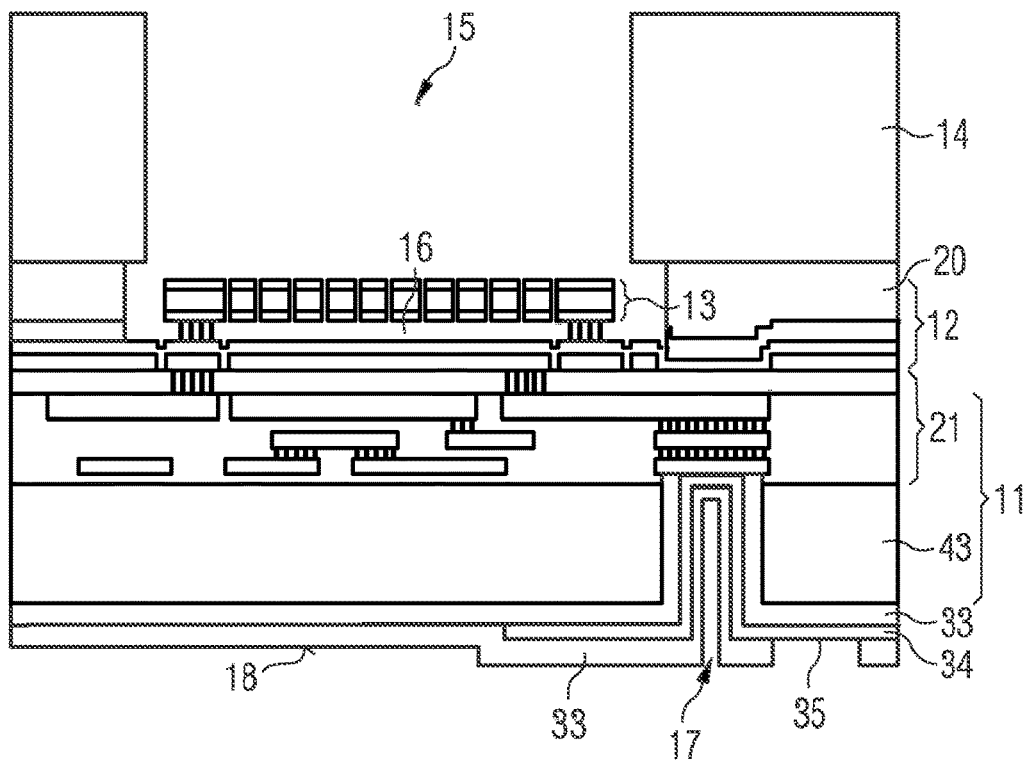

As shown in FIG. 5I in a next step the temporary handling wafer 36 is removed. The isolation layer 33 on the back side 18 of the substrate body 11 is patterned in such a way that a part of the electrically conductive material 34 is free of the isolation layer 33 and a bottom contact 35 of the pressure sensor device 10 is formed.

Figure 5J:
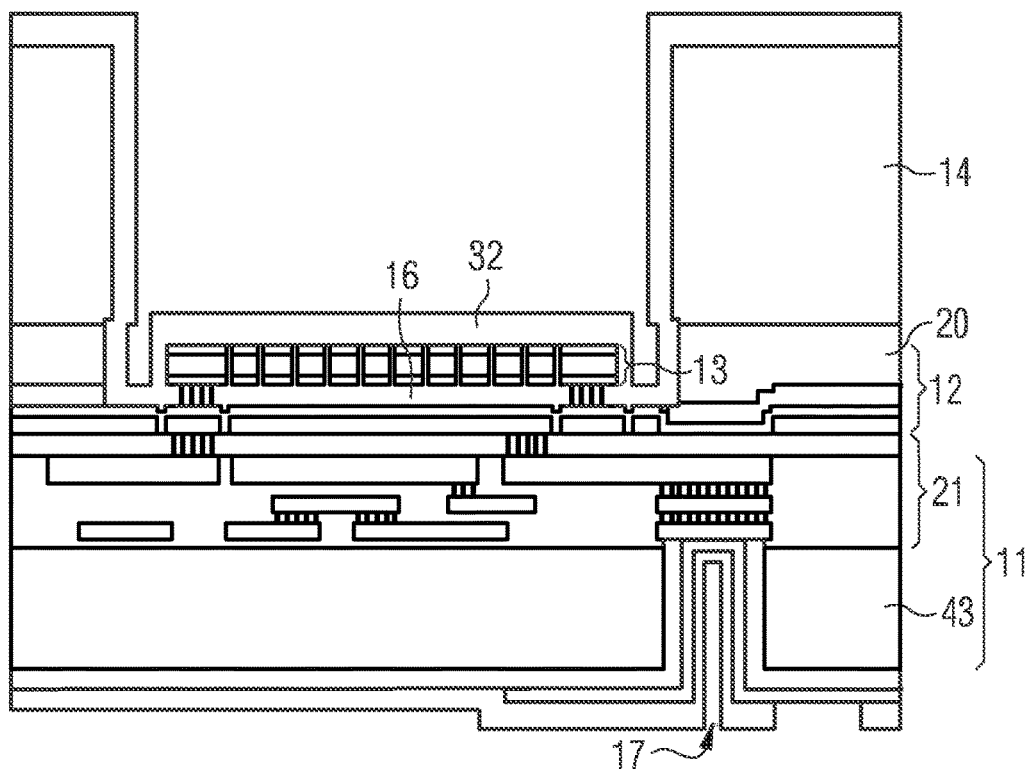

FIG. 5J shows that a sealing layer 32 is deposited onto the membrane 13. As described for FIG. 4F, the sealing layer 32 is a compressive film. Advantageously, the membrane 13 is only released after the formation of the electrically conductive via 17 in order to avoid membrane fracture during the processing and cleaning.

Figure 5K:
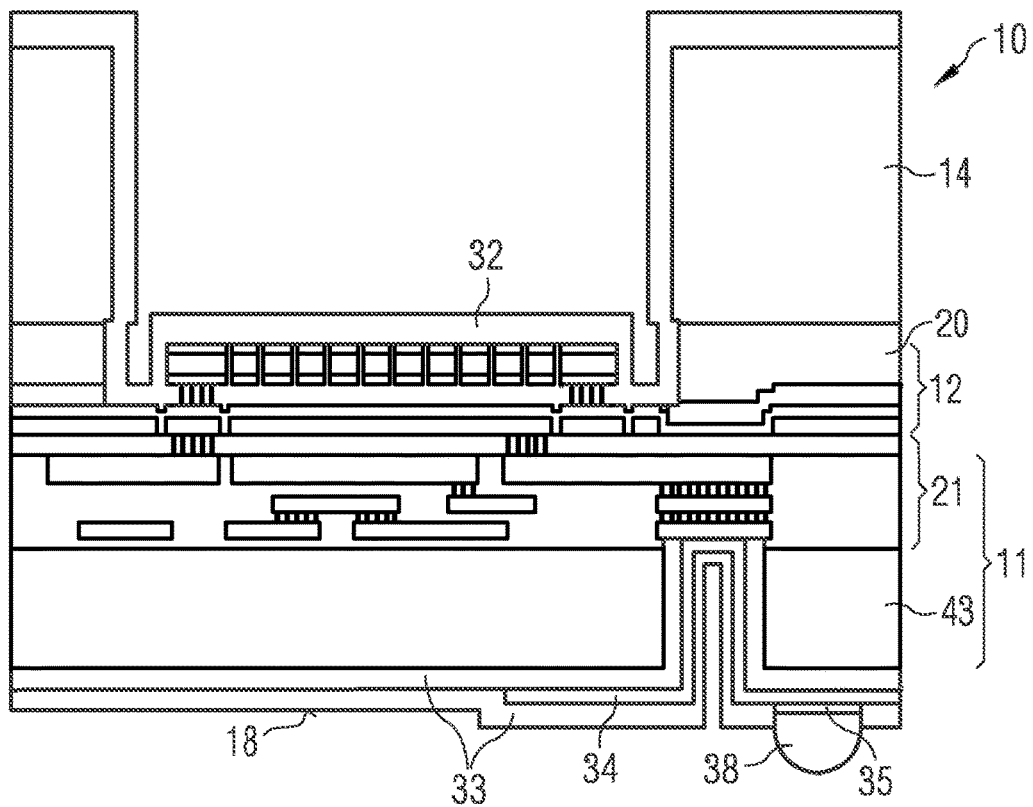

In FIG. 5K it is shown that the bottom contact 35 is contacted by a solder ball 38. At this processing stage the pressure sensor device 10 can be tested. As a next step, the pressure sensor device 10 is singulated by for example dicing.

FIG. 5L shows the dicing step. A dicing foil 42 is arranged on top of the pressure sensor device 10 which means that it is attached to the cap body 14 or the sealing layer 32 on top of the cap body 14. This arrangement has the advantage that the membrane 13 is protected during the dicing and it does not have to be cleaned after the dicing step. Furthermore, because of the thickness of the cap body 14 the dicing foil 42 will not stick to the membrane 13. Therefore, the dicing foil 42 can be removed without damaging the membrane 13.

FIG. 6 shows an exemplary embodiment of the pressure sensor device 10 with electrically conductive walls 29 arranged around the membrane 13. As described for FIG. 4C the electrically conductive walls 29 protect the top layer 20 from being etched during the release of the membrane 13. Here, it is shown that the electrically conductive walls 29 are arranged on top of the electrically conductive layer 25 with the adhesion layers 26 and 27. The handling wafer 36 is attached to the substrate body 11 by the adhesive 37 and the handling wafer 36 can be removed during processing. Advantageously, the adhesive 37 is compatible with high temperatures. If the adhesive 37 cannot be removed, it is required that it can be patterned such that the pressure sensor 12 and the integrated circuit 21 can be electrically contacted from the bottom side 18 of the substrate body 11.

FIG. 7 shows an exemplary embodiment of the pressure sensor device 10 where the opening 15 in the cap body 14 is positioned above the pressure sensor 12 in vertical direction z, and the lateral extension of the opening 15 is smaller than the lateral extension of the pressure sensor 12. A smaller opening 15 in the cap body 14 increases the mechanical stiffness of the pressure sensor device 10.

FIG. 8 shows an exemplary embodiment of the pressure sensor device 10 where the lateral extension of the opening 15 in the cap body 14 is reduced, and the sealing layer 32 covers the membrane 13 and the cap body 14. For a reduced opening 15, it is still necessary to cover the whole membrane 13 with the sealing layer 32.

FIG. 9 shows an exemplary embodiment of the pressure sensor device 10 with a reduced lateral extension of the opening 15 in the cap body 14 and the sealing layer 32 coating the membrane 13 and the cap body 14. In this case the opening 15 is very small and the membrane 13 comprises fewer etch openings 28 in order to guarantee that all etch openings 28 of the membrane 13 are covered with the sealing layer 32.

With FIGS. 10A to 10K an exemplary embodiment of the method for forming a pressure sensor device 10 is described. In this process flow the membrane 13 is released before introducing the electrically conductive via 17 in the substrate 43.

Figure 10A:
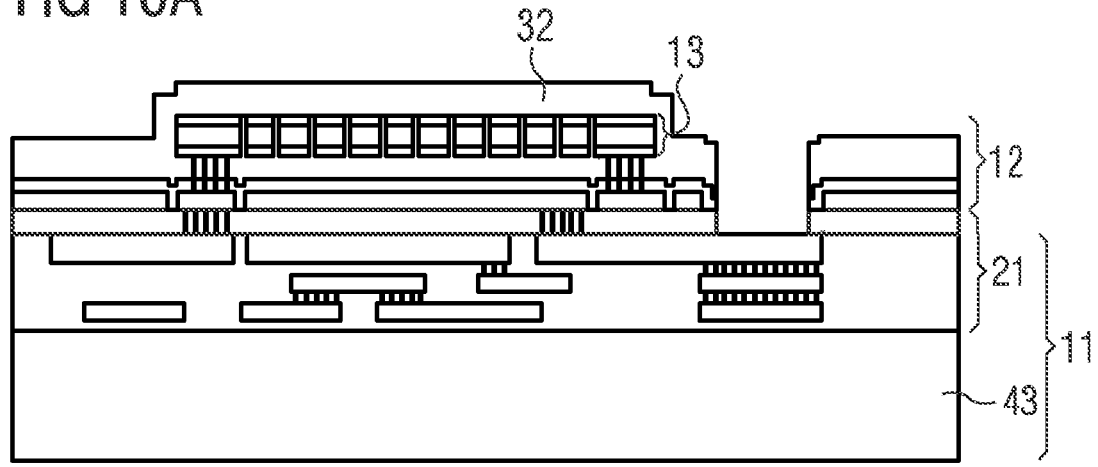

FIG. 10A shows the pressure sensor 12 on top of an integrated circuit 21 which is on top of the substrate 43.

The membrane 13 of the pressure sensor 12 is released and it is covered with the sealing layer 32.

Figure 10B:
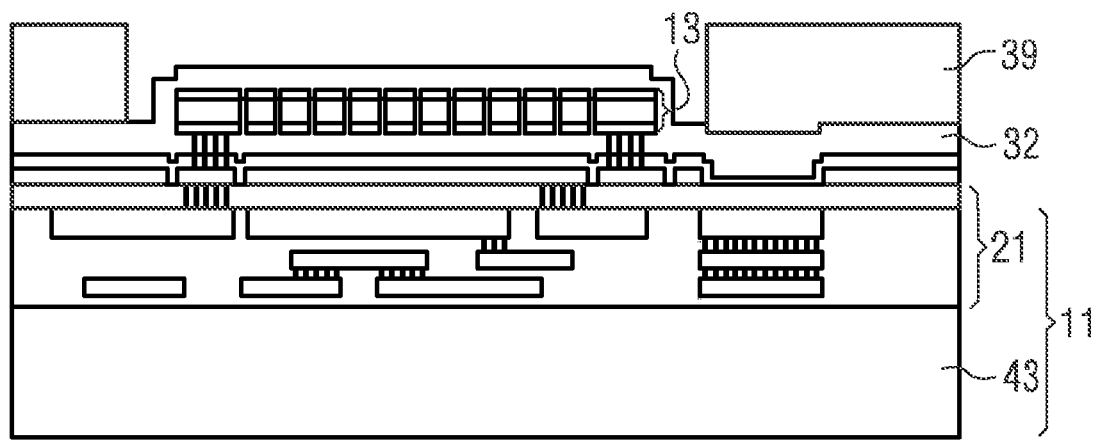

As shown in FIG. 10B in the next step of the method a photosensitive glue layer 39 is deposited on top of the sealing layer 32. The glue layer 39 can be for example approximately 25 µm thick. The glue layer 39 can be polyimide-based and it can withstand elevated temperatures. At next, the glue layer 39 is patterned by employing a mask 31 in such a way that the area of the membrane 13 is not covered with the glue layer 39. The glue layer 39 can be patterned by lithography.

Figure 10C:
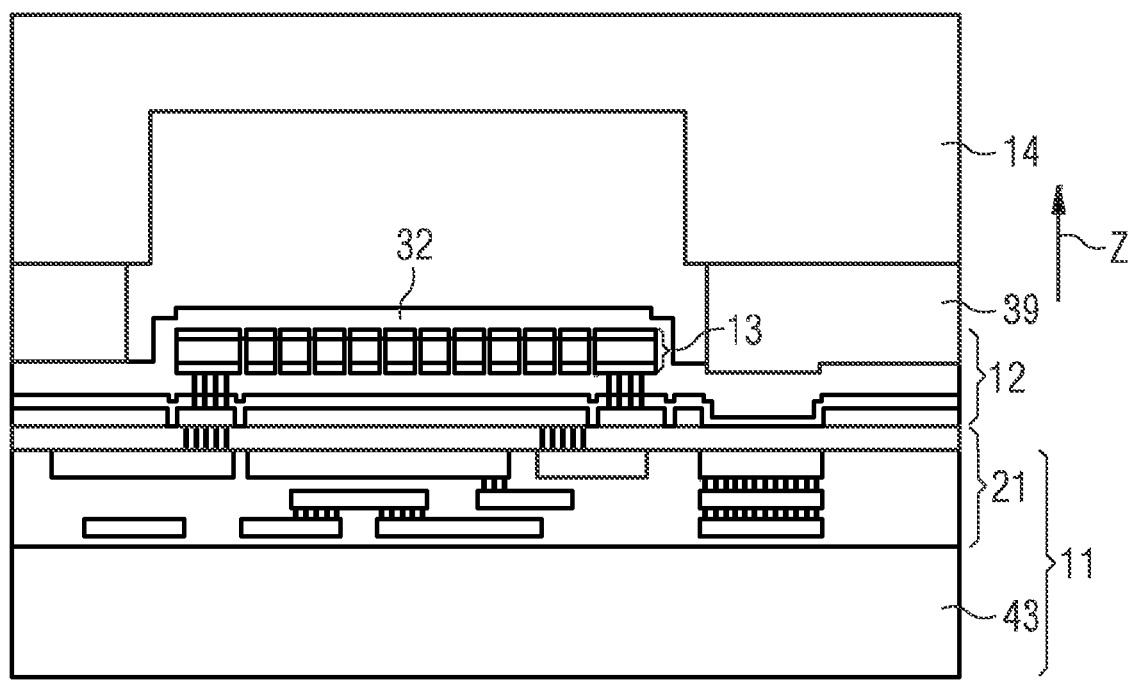

As shown in FIG. 10C the cap body 14 is patterned or etched in such a way that one or more recesses are formed in the cap body 14. The recesses can be formed by deep reactive ion etching and they can for example be approximately 300 µm deep. The recesses furthermore have a similar lateral extension as the membrane 13. The patterned cap body 14 is positioned on top of the glue layer 39 in such a way that a recess is positioned above the membrane 13 in vertical direction z. The cap body 14 is connected with the glue layer 39 for example at an elevated temperature of 250° C.

Figure 10D:
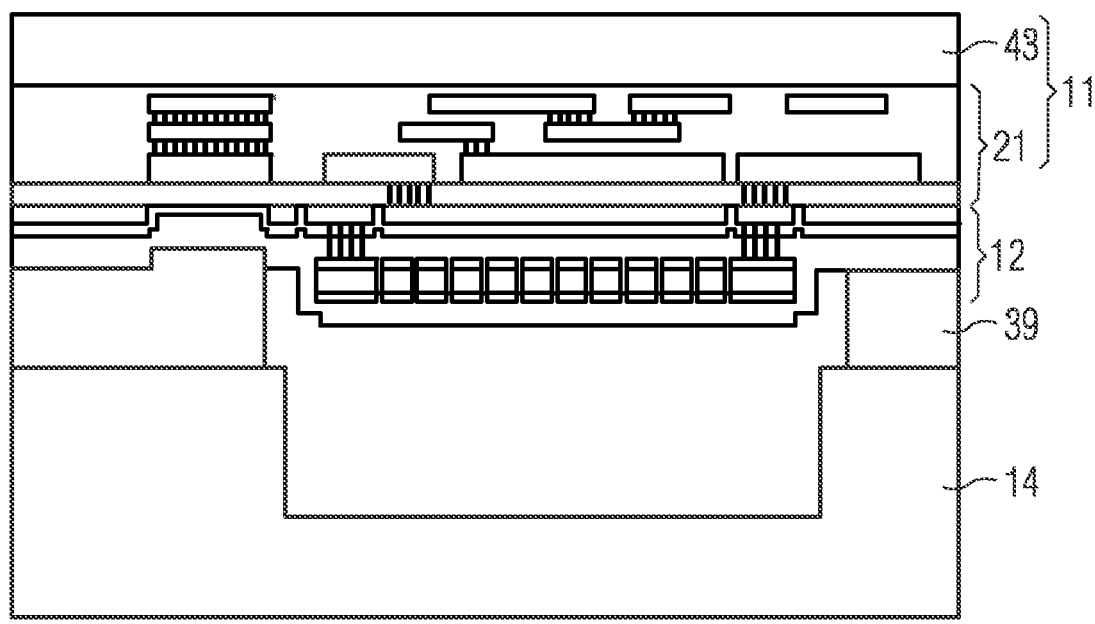

FIG. 10D shows that the substrate 43 is thinned to a thickness of approximately 100 to 200 µm.

Figure 10E:
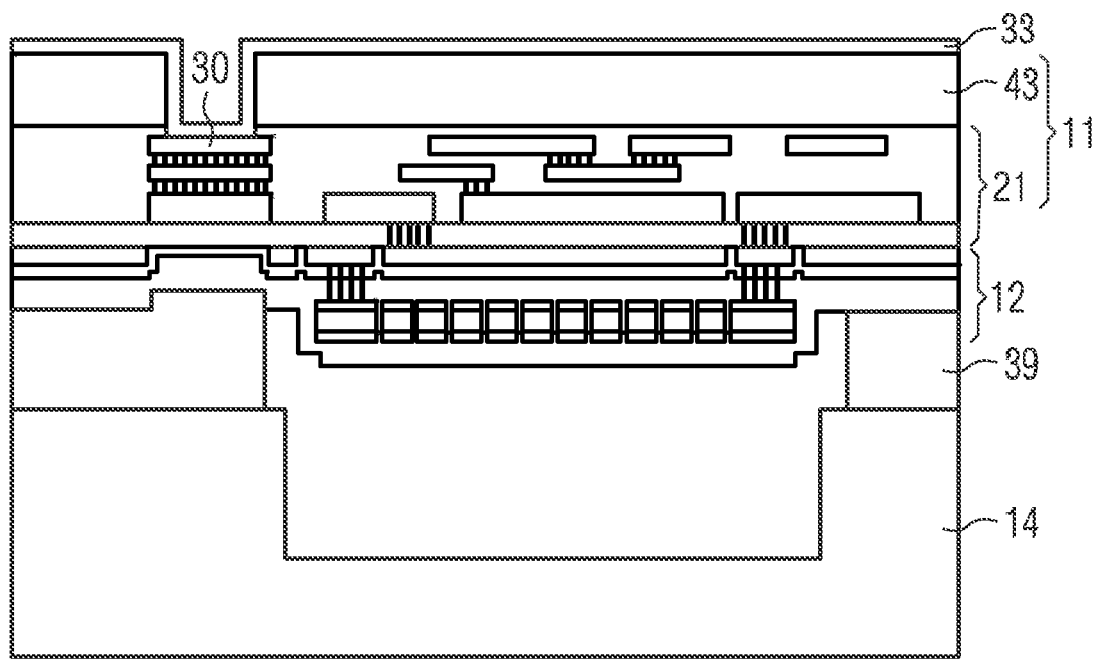

As shown in FIG. 10E a trench which is formed in the substrate 43 is coated with an isolation layer 33. The isolation layer 33 can comprise an oxide, a nitride or a polymer. As described for FIG. 4I the isolation layer 33 is in direct contact with the back contact 30 of the integrated circuit 21.

Figure 10F:
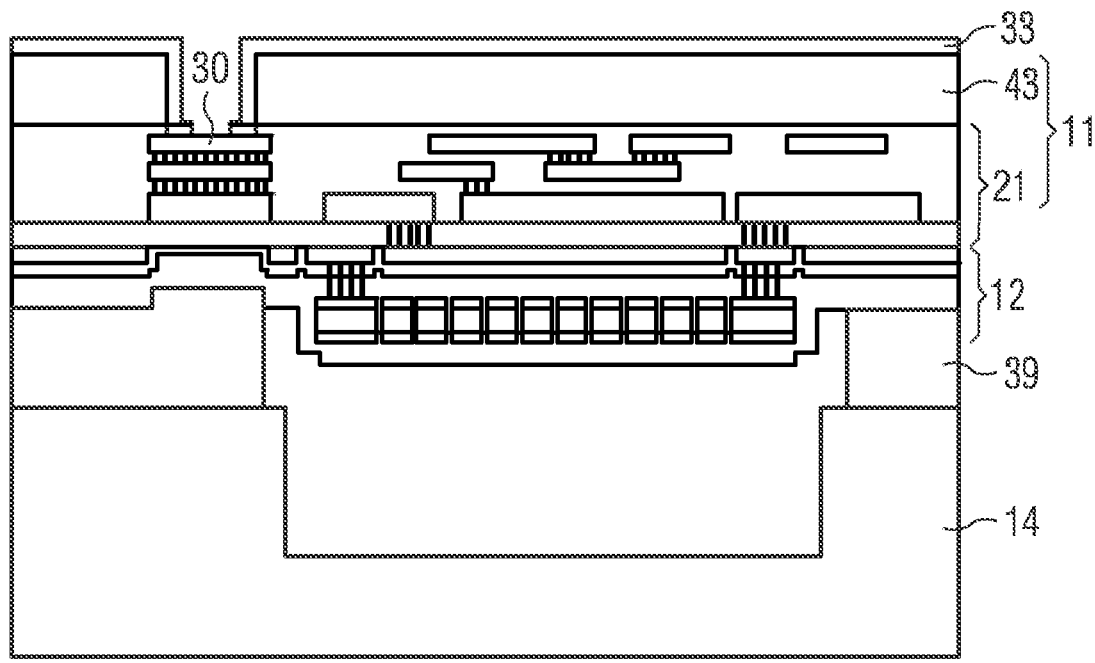

In FIG. 10F it is shown that the isolation layer 33 is removed on the back contact 30. At first, a resist layer 40 is deposited on the bottom side 18 of the substrate body 11. The resist layer 40 is patterned in such a way that the isolation layer 33 is free of the resist layer 40 around the back contact 30. The isolation layer 33 is removed from the back contact 30 by etching while the rest of the isolation layer 33 is protected by the resist layer 40. At next, the resist layer 40 is removed.

Figure 10G:
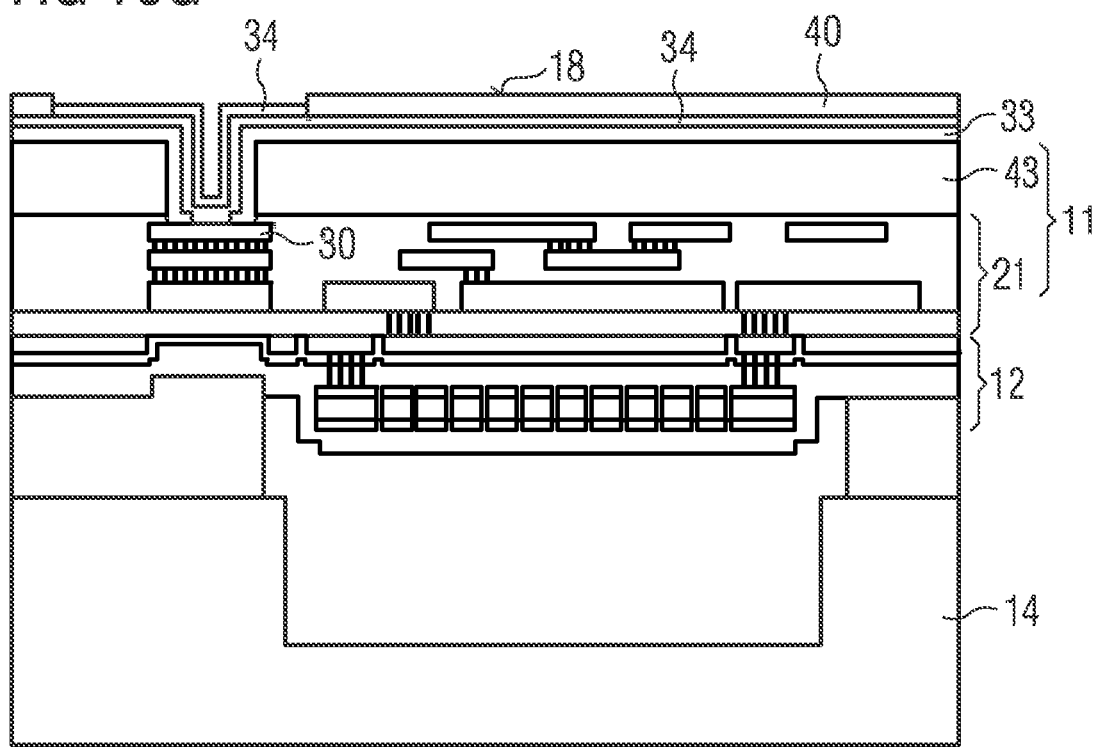

As shown in FIG. 10G in the next step of the method an electrically conductive material 34 is deposited on the bottom side 18. For example at first, tantalum or tantalum nitride can be deposited by physical vapor deposition, and in the next step copper is deposited also by physical vapor deposition. At next, another resist layer 40 is deposited and patterned. Afterwards, another electrically conductive material 34 which can be copper is deposited by electroplating through the resist layer.

Figure 10H:
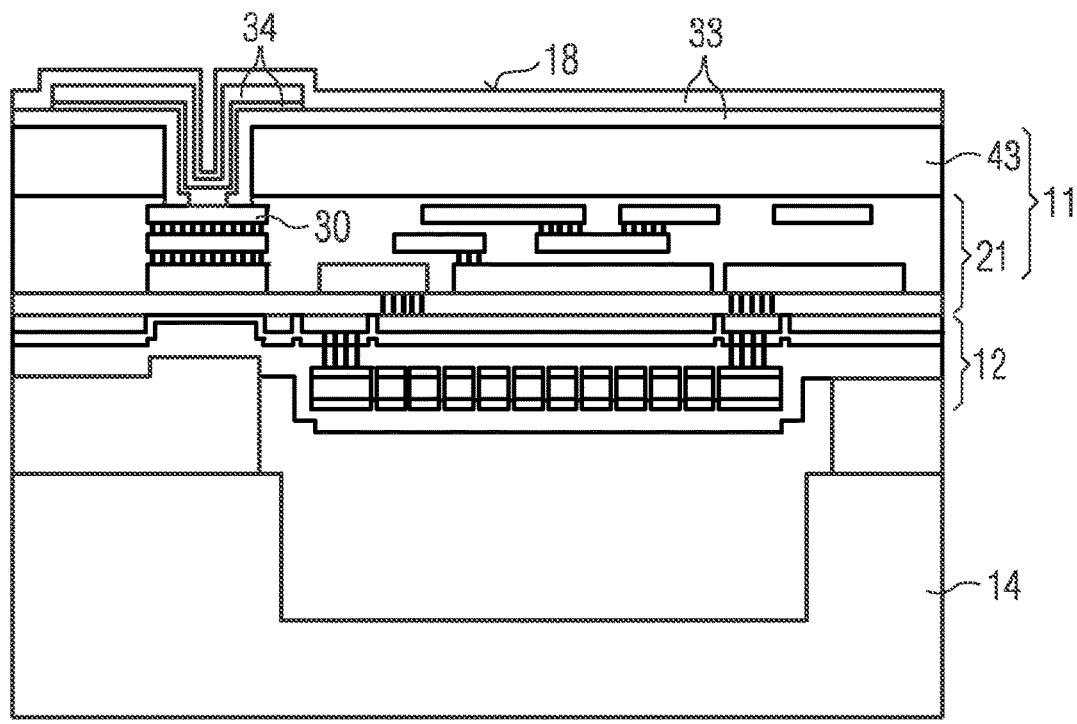

In FIG. 10H it is shown that the remaining resist layer 40 and a part of the electrically conductive material 34 which is not within the trench are removed. The electrically conductive material 34 is removed by wet etching. Moreover, a further isolation layer 33 is deposited on the bottom side 18 of the substrate body 11.

Figure 10I:
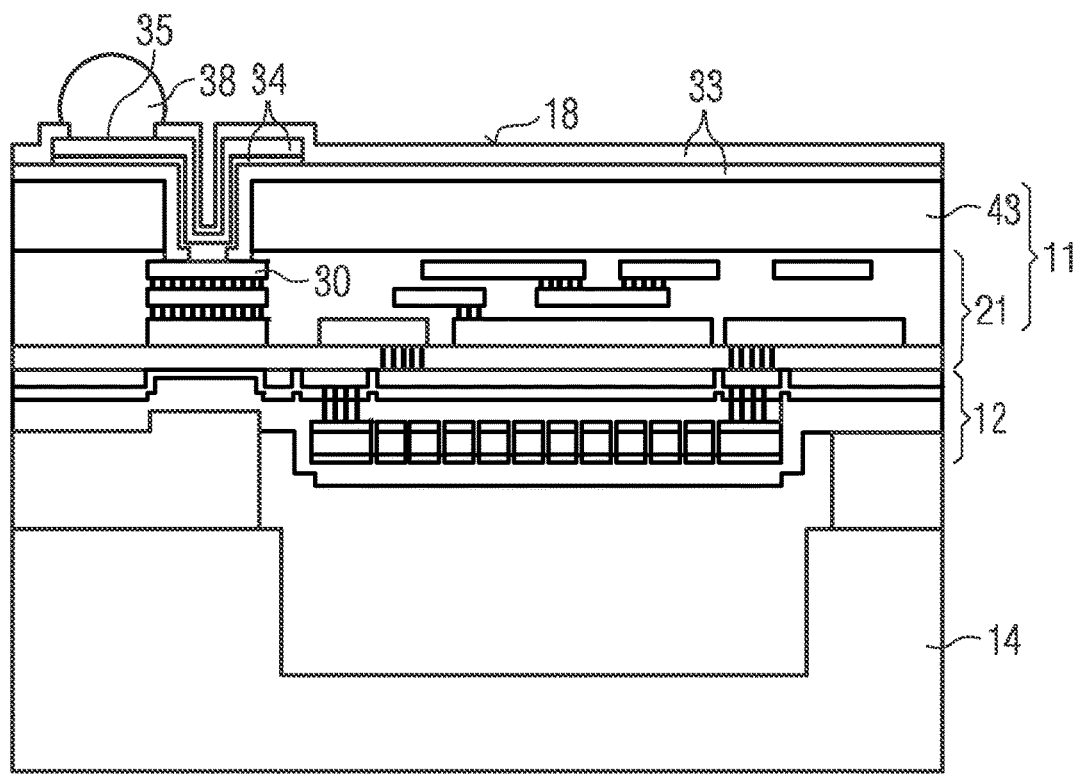

FIG. 10I shows that the further isolation layer 33 is patterned in such a way that a part of the electrically conductive material 34 is free of the isolation layer 33 and a bottom contact 35 of the pressure sensor device 10 is formed. The bottom contact 35 is electrically contacted with a solder ball 38.

Figure 10J:
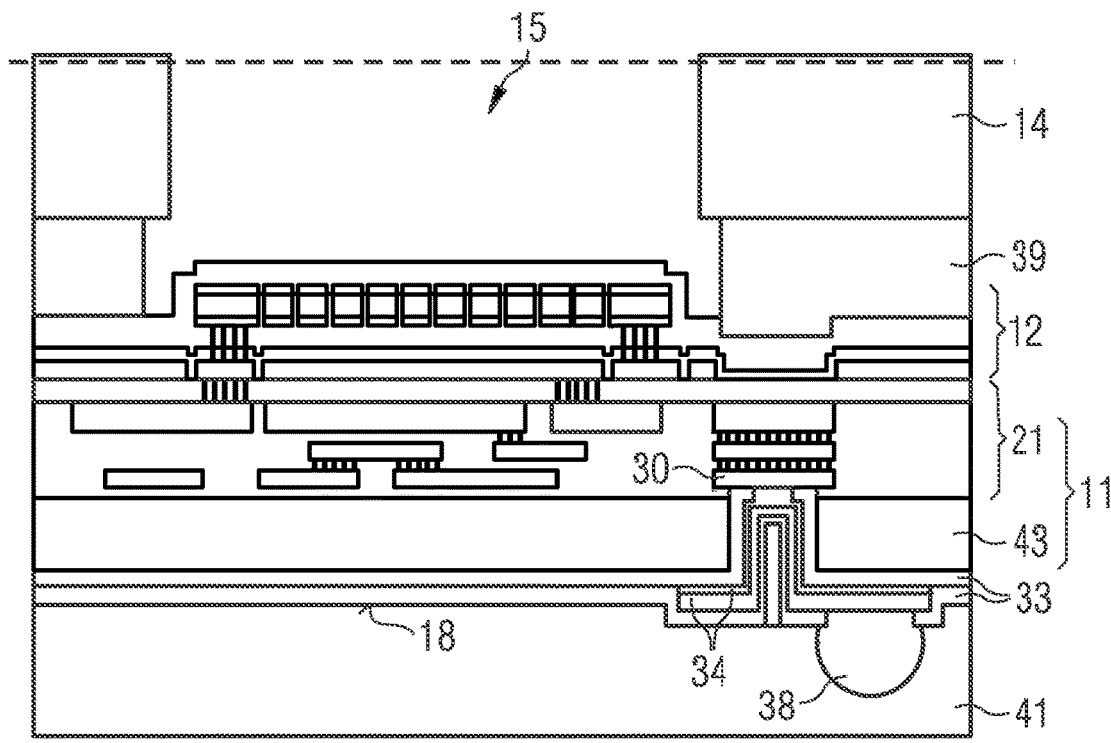

In FIG. 10J it is shown that a grinding tape 41 is applied to the bottom side 18 of the substrate body 11. At next, the cap body 14 is thinned to a thickness of for example approximately 230 µm. Then, the opening 15 is introduced in the cap body 14, such that the mass of the substrate body 11 equals approximately the mass of the cap body 14.

Figure 10K:
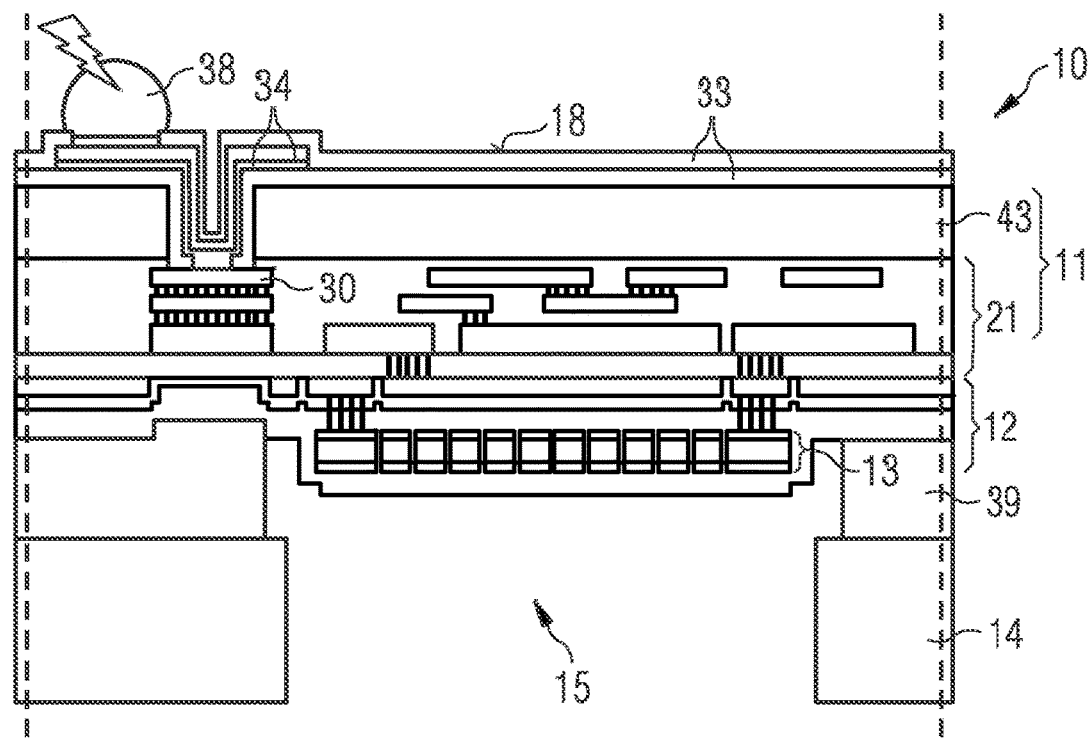

In FIG. 10K is shown that after removing the grinding tape 41 the pressure sensor device 10 can be tested and calibrated. The pressure sensor device 10 can be electrically contacted at the solder ball 38 and the membrane 13 can be exposed to air or other gas. Afterwards, the pressure sensor device 10 can be applied to a dicing foil 42 and it can be singulated via dicing.

The invention claimed is:

1. A pressure sensor device comprising:
a substrate body;
a pressure sensor comprising a membrane; and
a cap body comprising at least one opening,
wherein the pressure sensor is arranged between the substrate body and the cap body in a vertical direction which is perpendicular to a main plane of extension of the substrate body, and
wherein a mass of the substrate body amounts to at least 80% of the mass of the cap body and at most 120% of the mass of the cap body.

2. The pressure sensor device according to claim 1, wherein the mass of the substrate body amounts to at least 95% of the mass of the cap body and at most 105% of the mass of the cap body.

3. The pressure sensor device according to claim 1, wherein the pressure sensor comprises a capacitive pressure sensor comprising a cavity below the membrane.

4. The pressure sensor device according to claim 1, wherein the substrate body comprises at least one vertical, electrically conductive via and/or wherein the pressure sensor device is surface mountable.

5. The pressure sensor device according to claim 1, wherein the pressure sensor is positioned on top of an integrated circuit.

6. The pressure sensor device according to claim 1, wherein a top layer covers the pressure sensor on a side of the pressure sensor facing the cap body and the top layer and the cap body are connected via direct bonding.

7. The pressure sensor device according to claim 6, wherein the top layer comprises at least one electrically conductive wall, which is arranged on top of the pressure sensor, surrounds the opening, and is in direct contact with the pressure sensor and the cap body.

8. The pressure sensor device according to claim 1, wherein the opening in the cap body is positioned above the pressure sensor in the vertical direction and extends over a total lateral extension of the pressure sensor.

9. The pressure sensor device according to claim 1, wherein the opening in the cap body is positioned above the pressure sensor in the vertical direction and a lateral extension of the opening is smaller than a lateral extension of the pressure sensor.

* * * * *